United States Patent
Eummelen et al.

(10) Patent No.: US 11,231,653 B2
(45) Date of Patent: *Jan. 25, 2022

(54) FLUID HANDLING STRUCTURE AND LITHOGRAPHIC APPARATUS

(71) Applicant: ASML NETHERLANDS B.V., Veldhoven (NL)

(72) Inventors: Erik Henricus Egidius Catharina Eummelen, Veldhoven (NL); Giovanni Luca Gattobigio, Eindhoven (NL); Johannes Cornelis Paulus Melman, Oisterwijk (NL); Han Henricus Aldegonda Lempens, Weert (NL); Miao Yu, Best (NL); Cornelius Maria Rops, Waalre (NL); Ruud Olieslagers, Geldrop (NL); Artunç Ulucan, Eindhoven (NL); Theodorus Wilhelmus Polet, Geldrop (NL); Patrick Johannes Wilhelmus Spruytenburg, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 17/186,117

(22) Filed: Feb. 26, 2021

(65) Prior Publication Data
US 2021/0181641 A1 Jun. 17, 2021

Related U.S. Application Data

(63) Continuation of application No. 16/570,382, filed on Sep. 13, 2019, now Pat. No. 10,969,695, which is a
(Continued)

(30) Foreign Application Priority Data

Jan. 13, 2016 (EP) .................. 16151117
Feb. 4, 2016 (EP) .................. 16154229
Jun. 9, 2016 (EP) .................. 16173708

(51) Int. Cl.
G03F 7/20 (2006.01)
H01L 21/027 (2006.01)

(52) U.S. Cl.
CPC ........ G03F 7/70341 (2013.01); G03F 7/2041 (2013.01); G03F 7/70258 (2013.01); G03F 7/70716 (2013.01); H01L 21/0274 (2013.01)

(58) Field of Classification Search
CPC ............. G03F 7/70341; G03F 7/70258; G03F 7/70716; G03F 7/2041
(Continued)

(56) References Cited

U.S. PATENT DOCUMENTS 8,345,218 B2 1/2013 Riepen et al.
8,351,018 B2 1/2013 Direcks et al.
(Continued)

FOREIGN PATENT DOCUMENTS

CN 1892438 1/2007
CN 101900949 12/2010
(Continued)

OTHER PUBLICATIONS

International Search Report and Written Opinion issued for International Patent Application No. PCT/EP2016/080228, dated Mar. 16, 2017.
(Continued)

*Primary Examiner* — Hung Nguyen
(74) *Attorney, Agent, or Firm* — Pillsbury Winthrop Shaw Pittman, LLP

(57) ABSTRACT

An immersion lithographic apparatus having a fluid handling structure, the fluid handling structure configured to confine immersion fluid to a region and including: a meniscus controlling feature having an extractor exit on a surface
(Continued)

of the fluid handling structure; and a gas knife system outwards of the extractor exit and including passages each having an exit, the passages having a plurality of first passages having a plurality of corresponding first exits on the surface, and a plurality of second passages having a plurality of corresponding second exits outwards of the first exits on the surface, wherein the surface faces and is substantially parallel to a top surface of a substrate during exposure, and the first exits and the second exits are arranged at a greater distance from the substrate than the extractor exit.

20 Claims, 8 Drawing Sheets

Related U.S. Application Data continuation of application No. 16/063,583, filed as application No. PCT/EP2016/080228 on Dec. 8, 2016, now Pat. No. 10,416,571.

(58) Field of Classification Search
USPC ...................................................... 355/30, 72
See application file for complete search history.

(56) References Cited

U.S. PATENT DOCUMENTS

| | | | |
|---|---|---|---|
| 8,421,993 | B2 | 4/2013 | Direcks et al. |
| 8,547,523 | B2 | 10/2013 | Riepen et al. |
| 9,069,262 | B2 | 6/2015 | Cortie et al. |
| 9,256,136 | B2 | 2/2016 | Cortie et al. |
| 9,442,390 | B2 | 9/2016 | Cortie et al. |
| 10,133,190 | B2 | 11/2018 | Cortie et al. |
| 10,416,571 | B2 | 9/2019 | Eummelen |
| 10,969,695 | B2 * | 4/2021 | Eummelen .......... G03F 7/70258 |
| 2004/0207824 | A1 | 10/2004 | Lof et al. |
| 2007/0030464 | A1 | 2/2007 | Kemper et al. |
| 2007/0070315 | A1 | 3/2007 | Jacobs et al. |
| 2008/0192214 | A1 | 8/2008 | Leenders et al. |
| 2008/0212046 | A1 | 9/2008 | Riepen et al. |
| 2009/0201472 | A1 | 8/2009 | Kato et al. |
| 2010/0149514 | A1 | 6/2010 | Kemper et al. |
| 2010/0313974 | A1 | 12/2010 | Riepen et al. |
| 2011/0090472 | A1 | 4/2011 | Riepen et al. |
| 2011/0216292 | A1 | 9/2011 | Lafarre et al. |
| 2011/0228238 | A1 | 9/2011 | Roset et al. |
| 2011/0285976 | A1 | 11/2011 | Roset et al. |
| 2013/0016332 | A1 * | 1/2013 | Cortie ................ G03F 7/70866 355/72 |
| 2013/0033692 | A1 | 2/2013 | Bessems et al. |
| 2013/0050665 | A1 | 2/2013 | Thomas et al. |
| 2014/0285781 | A1 | 9/2014 | Sato |
| 2015/0309421 | A1 | 10/2015 | Cortie et al. |
| 2015/0323876 | A1 | 11/2015 | Kemper et al. |
| 2019/0285990 | A1 | 9/2019 | Cortie |

FOREIGN PATENT DOCUMENTS

| | | |
|---|---|---|
| CN | 102117018 | 7/2011 |
| CN | 102880007 | 1/2013 |
| CN | 104238277 | 12/2014 |
| CN | 104698767 | 6/2015 |
| EP | 1 420 298 | 5/2004 |
| EP | 2 381 310 | 10/2011 |
| JP | 2007-013151 | 1/2007 |
| JP | 2007-053329 | 3/2007 |
| JP | 2010-199619 | 9/2010 |
| JP | 2011-097107 | 5/2011 |
| JP | 2011-134776 | 7/2011 |
| JP | 2013-021331 | 1/2013 |
| JP | 2013-055337 | 3/2013 |
| TW | I232357 | 5/2005 |
| TW | 200951637 | 12/2009 |
| TW | 201137540 | 11/2011 |
| TW | 201142540 | 12/2011 |
| WO | 99/49504 | 9/1999 |
| WO | 2014/104139 | 7/2014 |

OTHER PUBLICATIONS

English Translation of Office Action isssued for ROC (Taiwan) Patent Application No. 106100677, dated Jan. 11, 2018.
Unknown, "Prevention of bubble fomration and capturing bubbles in immersion lithography, using segmented circular air knife," Mason Publications, Hampshire, GB, vol. 496, No. 61, Aug. 1, 2005.
Japanese Office action issued in corresponding Japanese Patent Application No. 2018-532061 dated May 27, 2019.
Office Action dated Sep. 29, 2020 issued in corresponding Japanese Patent Application No. 2019-191412.
Office Action dated Jul. 22, 2020 issued in corresponding Chinese Patent Application No. 2016800788290.
Office Action dated Nov. 5, 2019 issued in corresponding Chinese Patent Application No. 201680078829.0.
Office Action dated Jan. 30, 2020 issued in corresponding Korean Patent Application No. 10-2018-7023210.

* cited by examiner

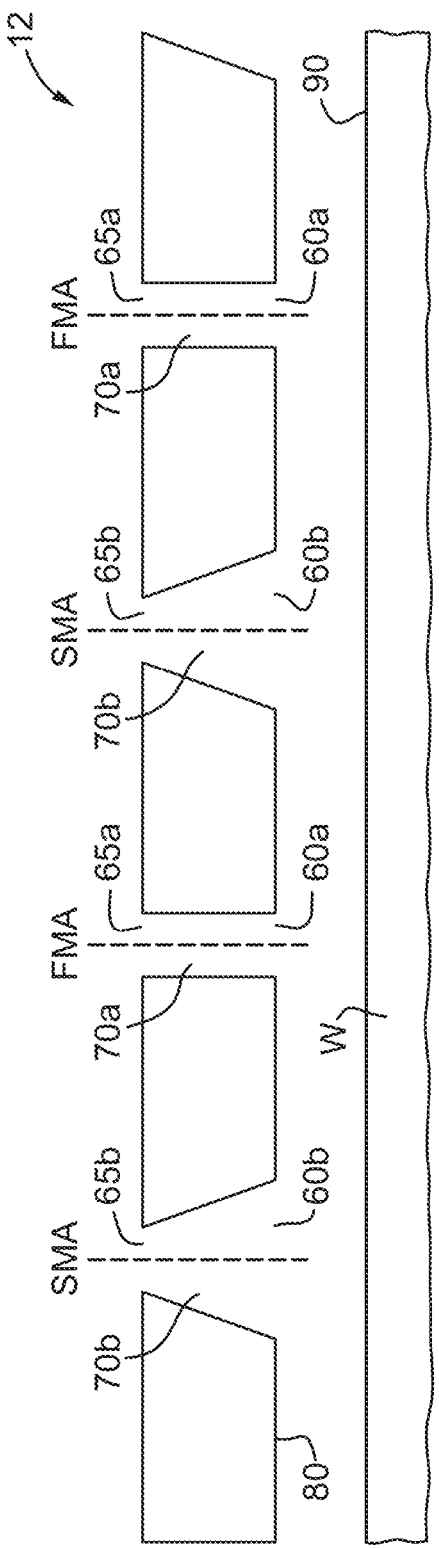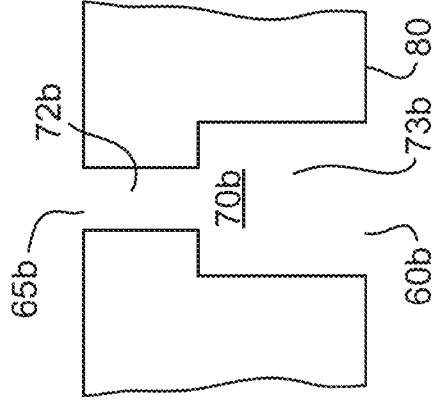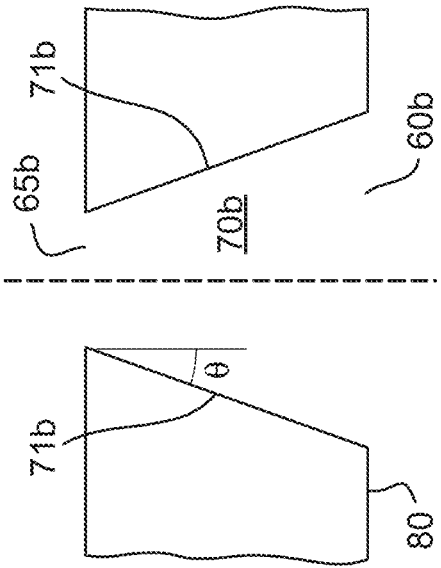

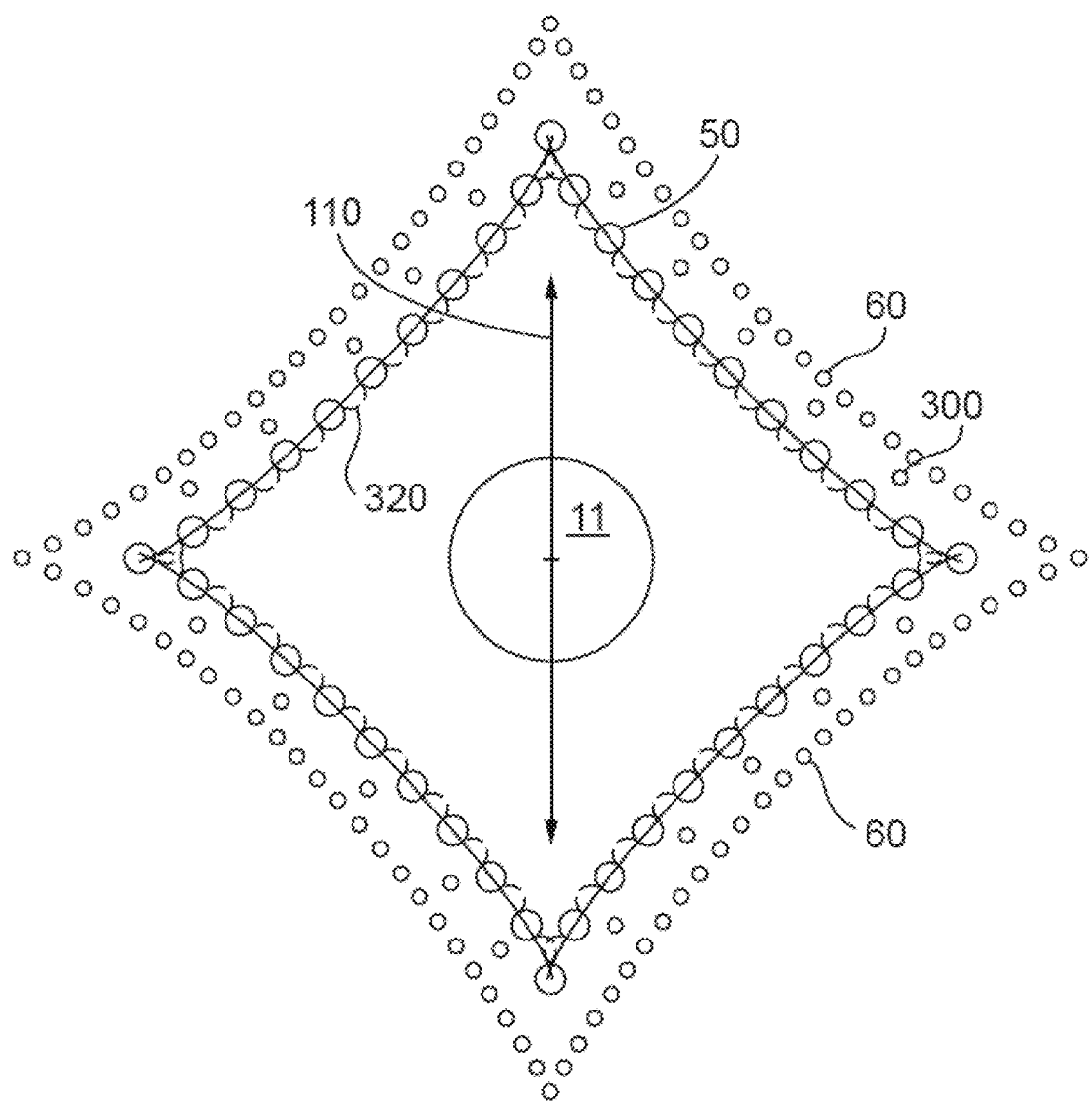

FLUID HANDLING STRUCTURE AND LITHOGRAPHIC APPARATUS

This application is a continuation of U.S. patent application Ser. No. 16/570,382, filed on Sep. 13, 2019, which is a continuation of U.S. patent application Ser. No. 16/063,583, filed on Jun. 18, 2018, now U.S. Pat. No. 10,416,571, which is the national phase entry of PCT patent application no. PCT/EP2016/080228, filed on Dec. 8, 2016, which claims the benefit of priority of European patent application no. 16151117.5, filed Jan. 13, 2016, of European patent application no. 16154229.5, filed on Feb. 4, 2016, and of European patent application no. 16173708.5, filed on Jun. 9, 2016, each of the foregoing applications is incorporated herein in its entirety by reference.

FIELD

The present description relates to a fluid handling structure, a lithographic apparatus and a method for manufacturing a device using a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits.

It has been proposed to immerse the substrate in the lithographic projection apparatus in an immersion fluid, e.g. a liquid having a relatively high refractive index, e.g. water, so as to fill a space between a final element of a projection system and the substrate. The immersion fluid may be distilled water, although another fluid can be used. An embodiment of the invention will be described with reference to immersion fluid. Many fluids may be suitable, particularly a wetting fluid, an incompressible fluid and/or a fluid with higher refractive index than air, desirably a higher refractive index than water. Fluids excluding gases are particularly desirable. The point of this is to enable imaging of smaller features since the exposure radiation will have a shorter wavelength in the fluid. (The effect of the fluid may also be regarded as increasing the effective numerical aperture (NA) of the system and also increasing the depth of focus.) Other immersion fluids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable include a hydrocarbon, such as an aromatic, a fluorohydrocarbon, and/or an aqueous solution.

In an immersion apparatus, immersion fluid is handled by an immersion system, device, structure or apparatus. In an embodiment the immersion system may supply immersion fluid and may be referred to as a fluid supply system. In an embodiment the immersion system may at least partly confine immersion fluid and may be referred to as a fluid confinement system. In an embodiment the immersion system may provide a barrier to immersion fluid and thereby be referred to as a barrier member, such as a fluid confinement structure. In an embodiment the immersion system creates or uses a flow of gas, for example to help in controlling the flow and/or the position of the immersion fluid. The flow of gas may form a seal to confine the immersion fluid so the immersion system may comprise a fluid handling structure, which may be referred to as a seal member, to provide the flow of gas. In an embodiment, immersion liquid is used as the immersion fluid. In that case the immersion system may be a liquid handling system.

However, use of an immersion system may lead to defects forming on a top surface of the substrate. Defects can be caused by a droplet of immersion fluid being left behind after the substrate passes under the fluid handling structure. In particular, at least two main mechanisms which result in defects are known, which are called bulldozing and film pulling. Defects on the surface of the substrate may lead to errors on the surface of the substrate which can reduce yield. Defects may mean watermarks in particular, or may mean other defects which may occur on the surface of the substrate.

Film pulling may occur as the substrate is moved relative to an immersion system (such as the fluid handling structure or the like). As the surface of the substrate moves relative to the immersion fluid, any variation (such as an edge of the substrate) or irregularity on the surface of the substrate may act as a meniscus pinning feature as the immersion fluid passes over it. This means that as the fluid handling structure moves relative to the substrate, the meniscus of the immersion fluid between the surface of the substrate and the fluid handling structure is stretched. After the fluid handling structure has moved a certain distance, the meniscus will eventually break and immersion fluid is left on the surface of the substrate resulting in droplets on the substrate which can lead to watermark defects. The remaining droplets may thus lead to errors on the surface of the photosensitive material which can reduce yield. Film pulling may be reduced by increasing the gas flow of a gas knife at a receding side of the fluid handling structure. However, this may have other consequences at an advancing side of the fluid handling structure. For example, using an increased gas flow for the gas knife will increase "bulldozing" at the advancing side of the fluid handling structure as described below.

Bulldozing may also occur when the substrate is moved relative to the fluid handling structure. Bulldozing occurs when a droplet of immersion fluid is encountered which is ahead of the fluid handling structure. As the substrate moves, the advancing portion of the fluid handling structure collides with the droplet of immersion fluid and the droplet is pushed forwards by the fluid handling structure. As the droplet is pushed forward, defects are created on the surface of the substrate. Although this may be effectively reduced by reducing the gas flow of a gas knife at the advancing side of the fluid handling structure, this may have other consequences. For example, using a reduced gas flow for the gas knife may mean that the confined immersion fluid is more likely to escape from the fluid handling structure at the receding side of the fluid handling structure, thus leading to further defects.

SUMMARY

It is desirable, for example, to provide a lithographic apparatus in which the defects are reduced.

In the present invention, there is provided an immersion lithographic apparatus comprising a fluid handling structure, the fluid handling structure configured to confine immersion fluid to a region and comprising a gas knife system, the gas knife system comprising passages each having an exit, the passages comprising a plurality of first passages having a plurality of corresponding first exits, and a plurality of second passages having a plurality of corresponding second exits, wherein at least one first passage and at least one second passage are configured such that the stagnation pressure of gas exiting the first exit is greater than the stagnation pressure of gas exiting the second exit, and the plurality of first passages and the plurality of second passages are intermingled and arranged in a line such that the first exits and the second exits form a side of a shape in plan view.

In the present invention, there is provided a device manufacturing method comprising: projecting a patterned beam of radiation onto a substrate, wherein the patterned beam of radiation is passed through a region of immersion fluid; confining the immersion fluid to the region using a fluid handling structure, wherein the fluid handling structure comprises a gas knife system; and generating a gas knife radially outward of the region, using the gas knife system, wherein the gas knife contributes to the confining step, and wherein the gas knife system comprises passages each having an exit, the passages comprising a plurality of first passages having a plurality of corresponding first exits, and a plurality of second passages having a plurality of corresponding second exits, wherein at least one first passage and at least one second passage are configured such that the stagnation pressure of gas exiting the first exit is greater than the stagnation pressure of gas exiting the second exit, and the plurality of first passages and the plurality of second passages are intermingled and arranged in a line such that the first exits and the second exits form a side of a shape in plan view.

In the present invention, there is provided an immersion lithographic apparatus comprising a fluid handling structure, the fluid handling structure configured to confine immersion fluid to a region and comprising a gas knife in use, the fluid handling structure comprising at least one exit, wherein the at least one exit is arranged so that the gas knife forms a side of a shape in plan view, and the at least one exit has a geometry configured to allow movement of a droplet of immersion fluid from a position radially outward of the gas knife to a position radially inward of the gas knife and configured to restrict movement of a droplet of immersion fluid from a position radially inward of the gas knife to a position radially outward of the gas knife.

In the present invention, there is provided an immersion lithographic apparatus comprising a fluid handling structure, the fluid handling structure configured to confine immersion fluid to a region and comprising a gas knife in use, wherein the fluid handling structure comprises at least one exit, the at least one exit being arranged so as to form the gas knife forming a side of a shape in plan view, wherein the side comprises two end portions along that side and a gap is formed between the two end portions along that side of the shape in plan view, one of the end portions comprising a bend, and wherein in use, a substrate is moved relative to the fluid handling structure in a scanning direction, and in a plane perpendicular to the scanning direction, one of the end portions is positioned to overlap with the other end portion such that there is no gap in the plane perpendicular to scanning direction.

In the present invention, there is provided a device manufacturing method comprising: projecting a patterned beam of radiation onto a substrate, wherein the patterned beam of radiation is passed through a region of immersion fluid; confining the immersion fluid to the region using a fluid handling structure of an immersion system, wherein the fluid handling structure comprises a gas knife system; and generating a gas knife radially outward of the region, using the gas knife system, wherein the gas knife contributes to the confining step, and the fluid handling structure comprising at least one exit, wherein the at least one exit is arranged so that the gas knife forms a side of a shape in plan view, and the at least one exit has a geometry configured to allow movement of a droplet of immersion fluid from a position radially outward of the gas knife to a position radially inward of the gas knife and configured to restrict movement of a droplet of immersion fluid from a position radially inward of the gas knife to a position radially outward of the gas knife.

In the present invention, there is provided a device manufacturing method comprising: projecting a patterned beam of radiation onto a substrate, wherein the patterned beam of radiation is passed through a region of immersion fluid; confining the immersion fluid to the region using a fluid handling structure of an immersion system, wherein the fluid handling structure comprises a gas knife system; and generating a gas knife radially outward of the region, wherein the fluid handling structure comprises at least one exit, the at least one exit being arranged so as to form the gas knife forming a side of a shape in plan view, wherein the side comprises two end portions along that side and a gap is formed between the two end portions along that side of the shape in plan view, and one of the end portions comprising a bend, and wherein in use, a substrate is moved relative to the fluid handling structure in a scanning direction, and in a plane perpendicular to the scanning direction, one of the end portions is positioned to overlap with the other end portion such that there is no gap in the in the plane perpendicular to scanning direction.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 4 depicts a cross-section through the fluid handling structure of one of the embodiments, along the length of a portion of the gas knife;

FIG. 5 depicts a close up of a portion of FIG. 4;

FIG. 6 depicts a variation of the shape of the passage depicted in FIG. 5;

FIG. 15 depicts a variation of the fluid handling structure depicted in FIG. 3.

DETAILED DESCRIPTION

Figure 1:
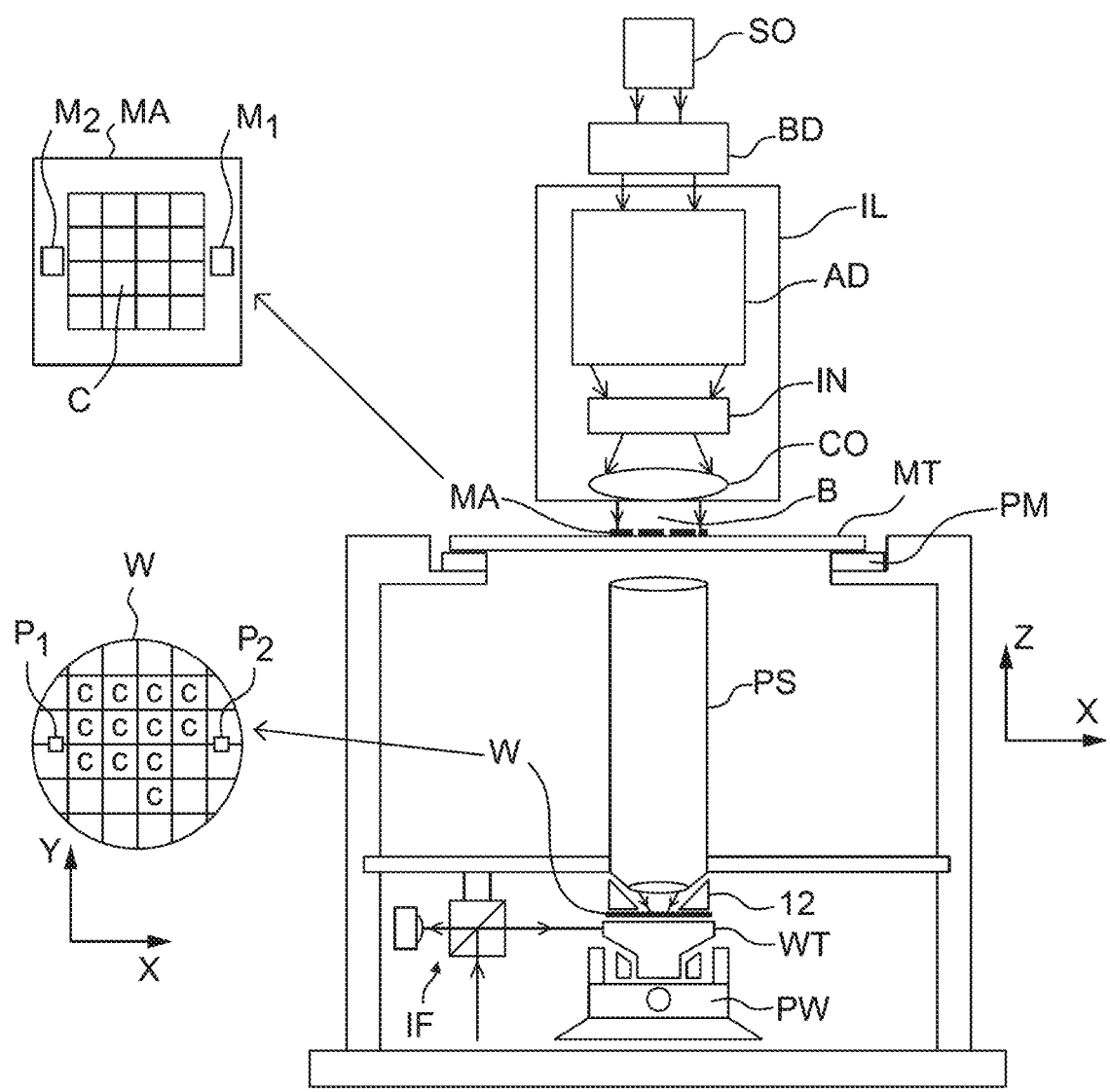
FIG. 1 depicts a lithographic apparatus according to an embodiment of the invention.

FIG. 1 schematically depicts a lithographic apparatus according to an embodiment of the invention. The lithographic apparatus comprises:

- an illuminator (otherwise referred to as an illumination system) IL configured to condition a projection beam B, the projection beam B being a radiation beam (e.g. UV radiation, DUV radiation or any other suitable radiation);
- a support structure (e.g. a mask support structure/mask table) MT constructed to support a patterning device (e.g. a mask) MA and connected to a first positioner PM configured to accurately position the patterning device MA in accordance with certain parameters;
- a support table, e.g. a sensor table to support one or more sensors, and/or a substrate table (e.g. a wafer table) WT or "substrate support" constructed to hold a substrate (e.g. a resist-coated substrate) W connected to a second positioning device PW configured to accurately position the substrate W in accordance with certain parameters; and
- a projection system (e.g. a refractive projection lens system) PS configured to project a pattern imparted to the projection beam B by patterning device MA onto a target portion C (e.g. comprising one or more dies) of the substrate W.

The illuminator IL may include various types of optical components, such as refractive, reflective, magnetic, electromagnetic, electrostatic or other types of optical components, or any combination thereof, for directing, shaping, or controlling radiation.

The support structure MT supports, i.e. bears the weight of, the patterning device MA. The support structure MT holds the patterning device MA in a manner that depends on the orientation of the patterning device MA, the design of the lithographic apparatus, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS. Any use of the terms "reticle" or "mask" herein may be considered synonymous with the more general term "patterning device."

The term "patterning device" used herein should be broadly interpreted as referring to any device that can be used to impart a projection beam B with a pattern in its cross-section such as to create a pattern in a target portion C of the substrate W. It should be noted that the pattern imparted to the projection beam B may not exactly correspond to the desired pattern in the target portion C of the substrate W, for example if the pattern includes phase-shifting features or so called assist features. Generally, the pattern imparted to the projection beam B will correspond to a particular functional layer in a device being created in the target portion C, such as an integrated circuit.

The patterning device MA may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam (e.g. a projection beam B) in different directions. The tilted mirrors impart a pattern in a projection beam B which is reflected by the mirror matrix.

The term "projection system" used herein should be broadly interpreted as encompassing any type of projection system PS, including refractive, reflective, catadioptric, magnetic, electromagnetic and electrostatic optical systems, or any combination thereof, as appropriate for the exposure radiation being used, or for other factors such as the use of an immersion fluid or the use of a vacuum. Any use of the term "projection lens" herein may be considered as synonymous with the more general term "projection system".

As here depicted, the lithographic apparatus is of a transmissive type (e.g. employing a transmissive mask). Alternatively, the lithographic apparatus may be of a reflective type (e.g. employing a programmable mirror array of a type as referred to above, or employing a reflective mask).

The lithographic apparatus may comprise a measurement table (not depicted in FIG. 1) that is arranged to hold measurement equipment, such as sensors to measure properties of the projection system PS. In an embodiment, the measurement table is not configured to hold a substrate W. The lithographic apparatus may be of a type having two (dual stage) or more tables (or stage or support), e.g., two or more substrate tables WT, or a combination of one or more substrate tables WT and one or more sensor or measurement tables. In such "multiple stage" machines the multiple tables may be used in parallel, or preparatory steps may be carried out on one or more tables while one or more other tables are being used for exposure. The lithographic apparatus may have two or more patterning device tables (or stages or support), e.g. two or more support structures MT, which may be used in parallel in a similar manner to substrate tables WT, sensor tables and measurement tables.

Referring to FIG. 1, the illuminator IL receives a projection beam B from a source SO of radiation. The source SO and the lithographic apparatus may be separate entities, for example when the source SO is an excimer laser. In such cases, the source SO is not considered to form part of the lithographic apparatus and the projection beam B is passed from the source SO to the illuminator IL with the aid of a beam delivery system BD comprising, for example, suitable directing mirrors and/or a beam expander. In other cases the source SO may be an integral part of the lithographic apparatus, for example when the source SO is a mercury lamp. The source SO and the illuminator IL, together with the beam delivery system BD if required, may be referred to as a radiation system.

The illuminator IL may comprise an adjuster AD configured to adjust the angular intensity distribution of the projection beam B. Generally, at least the outer and/or inner radial extent (commonly referred to as σ-outer and σ-inner, respectively) of the intensity distribution in a pupil plane of the illuminator IL can be adjusted. In addition, the illuminator IL may comprise various other components, such as an integrator IN and a condenser CO. The illuminator IL may be used to condition the projection beam B, to have a desired uniformity and intensity distribution in its cross-section. Similar to the source SO, the illuminator IL may or may not be considered to form part of the lithographic apparatus. For example, the illuminator IL may be an integral part of the lithographic apparatus or may be a separate entity from the lithographic apparatus. In the latter case, the lithographic apparatus may be configured to allow the illuminator IL to be mounted thereon. Optionally, the illuminator IL is detachable and may be separately provided (for example, by the lithographic apparatus manufacturer or another supplier).

The projection beam B is incident on the patterning device (e.g., mask) MA, which is held on the support structure (e.g., mask table) MT, and is patterned by the patterning device MA. Having traversed the patterning device MA, the projection beam B passes through the projection system PS, which focuses the projection beam B onto a target portion C of the substrate W. With the aid of the second positioning device PW and a position sensor IF (e.g. an interferometric device, linear encoder or capacitive sensor), the substrate table WT can be moved accurately, e.g. so as to position different target portions C in the path of the projection beam B. Similarly, the first positioning device PM and another position sensor (which is not explicitly depicted in FIG. 1) can be used to accurately position the patterning device MA with respect to the path of the projection beam B, e.g. after mechanical retrieval from a mask library, or during a scan.

In general, movement of the support structure MT may be realized with the aid of a long-stroke module (coarse positioning) and a short-stroke module (fine positioning), which both form part of the first positioning device PM. Similarly, movement of the substrate table WT may be realized using a long-stroke module and a short-stroke module, which both form part of the second positioning device PW. The long-stroke module is arranged to move the short-stroke module over a long range with limited precision. The short-stroke module is arranged to move the support structure MT and/or substrate table WT over a short range relative to the long-stroke module with high precision. In the case of a stepper (as opposed to a scanner) the support structure MT may be connected to a short-stroke actuator only, or may be fixed.

Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions C. Marks located in spaces between the target portions C are known as scribe-lane alignment marks). Similarly, in situations in which more than one die is provided on the patterning device MA, the mask alignment marks M1, M2 may be located between the dies.

The depicted lithographic apparatus may be used to expose a substrate W in at least one of the following modes of use:

1. In step mode, the support structure MT and the substrate table WT are kept essentially stationary, while an entire pattern imparted to the projection beam B is projected onto a target portion C at one time (i.e. a single static exposure). The substrate table WT is then shifted in the X direction and/or Y direction (i.e. a stepping direction) so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the projection beam B is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in a non-scanning direction) of the target portion C in a single dynamic exposure, whereas the length of the scanning motion determines the height (in a scanning direction) of the target portion C.

3. In another mode, the support structure MT is kept essentially stationary holding a programmable patterning device, and the substrate table WT is moved or scanned while a pattern imparted to the projection beam B is projected onto a target portion C. In this mode, generally a pulsed radiation source is employed as the source SO and the programmable patterning device is updated as required after each movement of the substrate table WT or in between successive radiation pulses during a scan. This mode of operation can be readily applied to maskless lithography that utilizes a programmable patterning device, such as a programmable mirror array of a type as referred to above.

Combinations and/or variations on the above described modes of use or entirely different modes of use may also be employed.

Arrangements for providing fluid between a final element of the projection system PS and the substrate W can be classed into three general categories of immersion system. These include a bath type arrangement, a localized immersion system and an all-wet immersion system. The present invention relates to the use of a localized immersion system.

The localized immersion system uses a fluid supply system in which fluid is only provided to a localized area of the substrate W. The area filled by fluid is smaller in plan than the top surface of the substrate W and the area filled with fluid remains substantially stationary relative to the projection system PS while the substrate W moves underneath that area. A meniscus controlling feature can be present to seal fluid to the localized area. One way which has been proposed to arrange for this is disclosed in PCT patent application publication no. WO 99/49504. The meniscus controlling feature may be a meniscus pinning feature.

Figure 2:
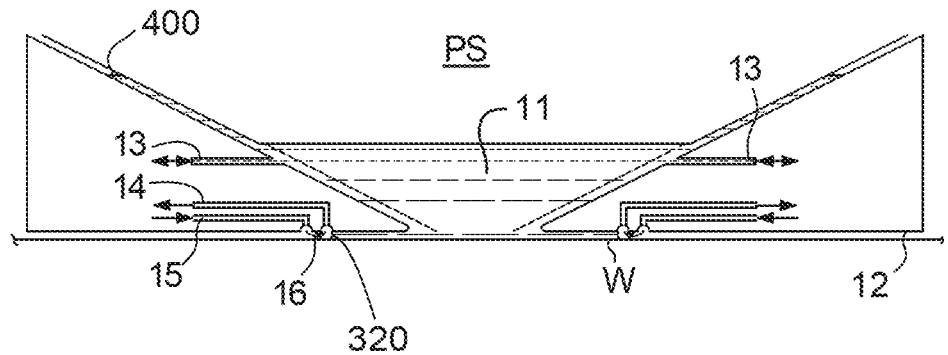
FIG. 2 depicts an immersion system for use in a lithographic projection apparatus.

FIG. 2 schematically depicts an immersion system (which can otherwise be referred to as a localized fluid supply system or fluid handling system) with a fluid handling structure 12 (which could also be referred to as a fluid confinement structure), which extends along at least a part of a boundary of a space 11 between a final element of the projection system PS and the substrate table WT or substrate W. Reference in the following text to surface of the substrate W also refers in addition or in the alternative to a surface of the substrate table WT, unless expressly stated otherwise. In an embodiment, a seal is formed between the fluid handling structure 12 and the surface of the substrate W and which may be a contactless seal such as a gas seal 16 (such a system with a gas seal is disclosed in European patent application publication no. EP 1,420,298). The seal can be provided by a meniscus controlling feature.

The fluid handling structure 12, for example as depicted in FIG. 2, at least partly confines fluid in the space 11 (which may otherwise be referred to as a region) between the final element of the projection system PS and the substrate W. The space 11 is at least partly formed by the fluid handling structure 12 positioned below and surrounding the final element of the projection system PS. Fluid is brought into the space 11 below the projection system PS and within the fluid handling structure 12 by opening 13. The fluid may be removed by opening 13. Whether fluid is brought into the space 11 or removed from the space 11 by the opening 13 may depend on the direction of movement of the substrate W and substrate table WT.

Figure 3:
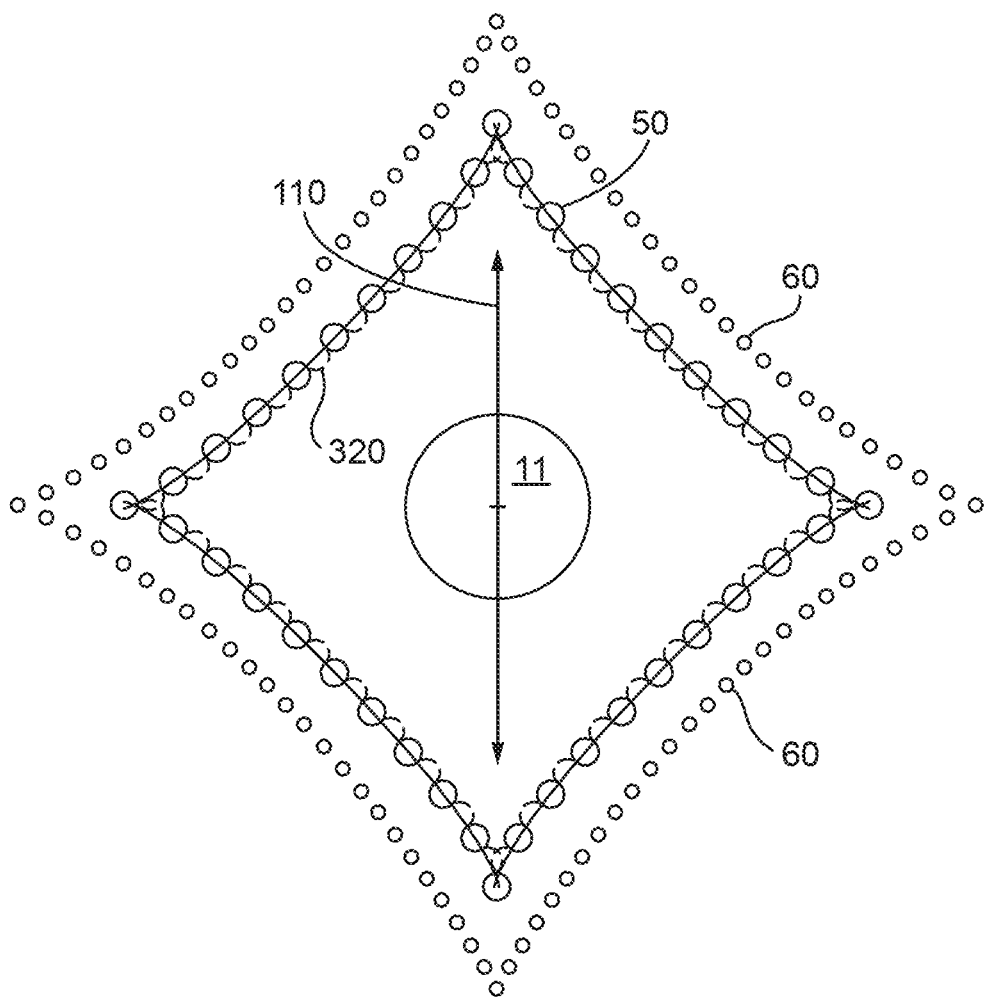
FIG. 3 depicts an embodiment of a fluid handling structure in plan view, including exits for gas forming the gas knife.

The fluid may be confined in the space 11 by the gas seal 16 which, during use, is formed between the bottom of the fluid handling structure 12 and the surface of the substrate W. As depicted in FIG. 3, a meniscus 320 is at the edge of the immersion fluid beneath the fluid handling structure 12. A further meniscus 400 is between the top of the fluid handling structure 12 and the final element of the projection system PS. The gas in the gas seal 16 is provided under pressure via inlet 15 to the gap between the fluid handling structure 12 and substrate W. The gas is extracted via a channel associated with outlet 14. The overpressure on the gas inlet 15, vacuum level on the outlet 14 and geometry of the gap are arranged so that there is a high-velocity gas flow inwardly that confines the fluid. The force of the gas on the fluid between the fluid handling structure 12 and the substrate W confines the fluid in the space 11. Such a system is disclosed in United States patent application publication no. US 2004-0207824, which is hereby incorporated by reference in its entirety.

FIG. 3 illustrates schematically and in plan meniscus controlling features of an immersion system including a fluid handling structure 12 which may have outlets using the gas drag principle and to which an embodiment of the present invention may relate. The features of a meniscus controlling feature are illustrated which may, for example, replace the meniscus controlling features depicted by the gas seal 16, provided by the inlet 15 and the outlet 14 in FIG. 2. The meniscus controlling feature of FIG. 3 is a form of extractor, for example a dual phase extractor. The meniscus controlling feature comprises a plurality of discrete openings 50. Each opening 50 is illustrated as being circular, though this is not necessarily the case. Indeed, the shape is not essential and one or more of the openings 50 may be one or more selected from: circular, elliptical, rectilinear (e.g. square, or rectangular), triangular, etc. and one or more openings may be elongate.

There may be no meniscus controlling features radially inwardly of the openings 50. The meniscus 320 is pinned between the openings 50 with drag forces induced by gas flow into the openings 50. A gas drag velocity of greater than about 15 m/s, desirably about 20 m/s is sufficient. The amount of evaporation of fluid from the substrate W may be reduced, thereby reducing both splashing of fluid as well as thermal expansion/contraction effects.

Various geometries of the bottom of the fluid handling structure are possible. For example, any of the structures disclosed in U.S. patent application publication no. US 2004-0207824 or U.S. patent application publication no. US 2010-0313974 could be used in an embodiment of the present invention. An embodiment of the invention may be applied to a fluid handling structure 12 which has any shape in plan, or has a component such as the outlets are arranged in any shape. Such a shape in a non-limiting list may include an ellipse such as a circle, a rectilinear shape such as a rectangle, e.g. a square, or a parallelogram such as a rhombus or a cornered shape with more than four corners such as a four or more pointed star, for example, as depicted in FIG. 3.

Known lithographic apparatus may comprise a fluid handling structure 12 comprising a gas knife. The gas knife can be used to help confine immersion fluid to the space 11. Therefore, the gas knife can be useful in preventing immersion fluid from escaping from the space 11, which could later lead to defects. Providing a strong gas knife is useful in preventing film pulling because a strong gas knife will reduce or prevent the amount of immersion fluid which is dragged behind the fluid handling structure 12, and may break up the film faster to reduce the amount of immersion fluid left behind the fluid handling structure 12. However, when the gas knife is strong, this may make defects on the advancing side of the gas knife worse, because as the gas knife collides with droplets of immersion fluid on the surface of the substrate W, a strong gas knife will not allow immersion fluid droplets to pass inwards of the gas knife. This means that the droplets of immersion fluid will be pushed forwards by the advancing side of the fluid handling structure 12 which can lead to bulldozing. As film pulling and bulldozing both cause defects which increase errors and possibly reduce yield, it is beneficial to provide a fluid handling structure 12 which addresses both of these issues simultaneously.

In the present invention an immersion lithographic apparatus is provided which comprises a fluid handling structure 12. The fluid handling structure 12 may be as described above, for example in relation to FIG. 3. The fluid handling structure 12 is configured to confine immersion fluid to a region and comprises a gas knife system. The gas knife system may be configured to generate a gas knife in use. The gas knife may be radially outward of the space 11 (otherwise referred to as the region) and may contribute to confining the immersion fluid. The gas knife system comprises passages each having an exit 60. The gas knife may be formed by gas exiting the exits 60 in use. The exits 60 form at least one side of a shape in plan view. The exits 60 may form at least one, multiple or all the sides of the shape in plan view. For example, the exits 60 may form the sides of a four pointed star as shown in FIG. 3. The shape may have a plurality of sides, for example any appropriate number of sides may be provided, e.g. 3, 4, 5, 6, 7, 8, 9, 10 or more. As described above, the exits 60 may form the sides of any shape and this is not particularly limiting. FIG. 3 depicts the scanning direction 110 as in-line with two of the points of the four point star but this may not be the case. The shape formed by the gas knife may be aligned with the scanning direction 110 in any selected orientation. As depicted in FIG. 4, the passages comprises a plurality of first passages 70a having a plurality of corresponding first exits 60a, and a plurality of second passages 70b having a plurality of corresponding second exits 60b. The gas knife is formed in use by gas exiting the first exits 60a and the second exits 60b.

In a first embodiment, the at least one first passage 70a and the at least one second passage 70b are configured such that the stagnation pressure of gas exiting the first exit 60a is greater than the stagnation pressure of gas exiting the second exit 60b. The stagnation pressure is the pressure that would be reached if an isentropic process were used to bring a fluid to rest. In other words, the stagnation pressure is the pressure at a stagnation point in a fluid where the fluid velocity is zero and all kinetic energy has been converted to pressure by an adiabatic, reversible (i.e. isentropic) process. The different stagnation pressure means that when in use, the stagnation pressure of the gas knife on the substrate W varies such that it is greater in areas with gas supplied by the first exit 60a and less in areas supplied by the second exit 60b. This correlates to having "strong jets" in the gas knife which are useful for creating de-wetting points to break the film to reduce film pulling and "soft jets" to reduce bulldozing.

For previously known apparatus, it is known that increasing the stagnation pressure of the gas knife may reduce the film pulling at the receding side of the fluid handling structure 12, however, this can have an adverse effect on bulldozing at the advancing side of the fluid handling structure 12. Therefore, increase of the stagnation pressure of the gas knife may be limited and a balance of higher stagnation pressure and lower stagnation pressure needs to be reached. The principle of the present invention relates to having a mix of higher stagnation pressure points and lower stagnation pressure points along one side of the fluid handling structure 12, and the mix of higher and lower stagnation pressures has a different effect depending on whether it is on an advancing or receding side. Providing the "soft jets" (i.e. low stagnation pressure) may reduce the bulldozing at the advancing side of the fluid handling structure 12 because when bulldozing does occur, some droplets of immersion fluid may move radially inward of the gas knife due to the "soft jets". In known apparatus which has uniform gas flow and velocity, to reduce bulldozing effects at the advancing side of a fluid handling structure, it is necessary to reduce the gas flow from the gas knife everywhere. However, reducing the stagnation pressure of the gas can increase film pulling at the receding side. However, in the present invention, film pulling will not be negatively affected by the reduced stagnation pressure due to the presence of the "strong jets" (i.e. high stagnation pressure). In other words, in the present invention, the stagnation pressure is lower for the "soft jets" which reduces bulldozing, but the film pulling is improved using "strong jets" compared to known apparatus which would require the stagnation pressure of the whole gas knife to be reduced everywhere.

The plurality of first exits 60a and the plurality of second exits 60b may be intermingled and arranged in a line. This means that along a line of exits, i.e. along the gas knife, there may be some first exits 60a and some second exits 60b. Thus, the gas knife is formed of strong jets and soft jets. As described later, this may be in a repeating and/or uniform pattern (e.g. alternating first exits 60a and second exits 60b). The plurality of first exits 60a and second exits 60b form at least one side of the shape in plan view as described above. The at least one first passage 70a could mean one or plural, possibly meaning all, for example all of the first passages 70a each having the shape described. The same applies to the at least one second passage 70b.

Alternatively, in the embodiment, the velocity (v) of the gas exiting the first exit 60a and the gas exiting the second exit 60b may be compared, i.e. the velocity may be referred to rather than the stagnation pressure. The velocity is the exit velocity of the gas exiting the first gas exit 60a at the first gas exit 60a and/or the second gas exit 60b at the second gas exit 60b respectively. The stagnation pressure is related to the velocity of the gas exiting either of the first exit 60a and the second exit 60b. An increase in the stagnation pressure corresponds to an increase in $\rho v^2$, wherein p is the density of the gas exiting the first exit 60a and the second exit 60b. Thus, changes in the stagnation pressure are relatable to changes in the velocity, and the velocity may be used as a parameter of gas exiting the first exit 60a and the second exit 60b as described in the embodiment below. It will be understood that a conversion of values would be needed but that the principles remain the same.

There may be any number of first passages 70a and second passages 70b, and the first exits 60a and the second exits 60b may be formed of a variety of shapes, e.g. discrete circular holes, or holes of other shape, or slits, etc.

The gas knife is formed in use by gas exiting the first exits 60a and the second exits 60b. In other words, the gas knife is formed in use by gas exiting both of the first exits 60a and the second exits 60b. In this way, the gas knife is formed have a stagnation pressure profile, and the stagnation pressure profile along the gas knife varies depending on whether the gas at any particular point along the gas knife exited a first exit 60a or a second exit 60b.

This means that the gas knife is formed from gas exiting the first exits 60a and the second exits 60b, which means that the gas forming the gas knife is at different stagnation pressures depending on which passage the gas passes through. As such, the stagnation pressure profile of the gas knife is not the same along the length of the gas knife.

At the second exits 60b, the gas exits at a lower stagnation pressure (i.e. the soft jets) which means that droplets of immersion fluid which are present on the surface of the substrate W may be able to pass through, for example, at the advancing side of the fluid handling structure 12. Therefore, droplets of immersion fluid which collide with the gas knife can pass through and may enter into the space 11. This may reduce or prevent the number of droplets which are pushed along the surface of the substrate W causing a watermark.

At the first exits 60a, the gas exits at a higher stagnation pressure (i.e. the strong jets), which means that the gas may form discrete points of high stagnation pressure. The higher stagnation pressure areas of the gas knife may break up a film, for example, at the receding side of the fluid handling structure 12, which has formed due to film pulling. In other words, these discrete points of higher pressure penetrates the film of the immersion fluid below. This means that the extent to which immersion fluid is pulled along the surface of the substrate W at the receding side of the fluid handling structure 12 may be reduced or prevented which may reduce or prevent immersion fluid being left behind as the surface of the substrate W passes under the fluid handling structure 12 and may also reduce the thickness of the film on the surface of the substrate W. Thus forming the gas knife from first exits 60a and second exits 60b from which gas exits at different stagnation pressures may reduce or prevent film pulling and/or bulldozing, depending on the location of the immersion fluid with respect to the fluid handling structure 12, i.e., whether the side is the advancing side or the receding side of the fluid handling structure 12.

The stagnation pressure of gas exiting the second exit 60b may preferably be approximately greater than or equal to 5 mbars, or preferably approximately greater than or equal to 10 mbars. The stagnation pressure of gas exiting the second exit 60b may preferably be approximately less than or equal to 500 mbars, or preferably approximately less than or equal to 400 mbars. The stagnation pressure of gas exiting the second exit 60b may preferably be approximately between 5 mbars and 500 mbars, or more preferably approximately between 10 mbars to 400 mbars. The stagnation pressure of gas exiting the first exit 60a may preferably be approximately greater than or equal to 40 mbars, or preferably approximately greater than or equal to 100 mbars. The stagnation pressure of gas exiting the first exit 60a may preferably be approximately less than or equal to 500 mbars, or preferably approximately less than or equal to 400 mbars. The stagnation pressure of gas exiting the first exit 60a may preferably be approximately between 40 mbars and 500 mbars or more preferably approximately between 100 mbars to 400 mbars.

The at least one first passage 70a may have a first entrance 65a and the at least one second passage 70b may have a second entrance 65b. There may be a corresponding entrance for every exit. Thus, the first passage 70a may have a corresponding first entrance 65a and first exit 60a and the second passage 70b may have a corresponding second entrance 65b and second exit 60b. The first passage 70a may have more than one entrance or exit. The second passage 70b may have more than one entrance or exit.

The pitch between the first passage 70a and the second passage 70b may be determined as the distance from a center of the cross-sectional area of the first entrance 65a to a center of the cross-sectional area of the second entrance 65b. As described below, if different patterns of first passage 70a and second passages 70b are used, the pitch is determined as the distance between the centers of the cross-sectional area of adjacent entrances. The pitch may preferably be greater than or equal to approximately 100 µm, or more preferably, approximately 200 µm. The pitch may preferably be less than or equal to approximately 1000 µm, or preferably approximately 500 µm, or more preferably, approximately 400 µm. The pitch may preferably be between approximately 100 µm to 1000 µm, or preferably between approximately 100 µm to 500 µm, or more preferably, the pitch may be between approximately 200 µm to 400 µm.

There are different ways in which the stagnation pressure at the different exits 60a, 60b may be varied. For example, the first passage 70a and second passage 70b may be connected to different gas sources having different flow rates, e.g. that at least one first passage 70a may be connected to a first gas source and the at least one second passage 70b may be connected to a second gas source. There may be further methods of providing gas from the second exit 60b at a reduced stagnation pressure compared to the gas exiting the first exit 60a. For example, the first passage 70a and/or the second passage 70b may comprise a variable or fixed restrictor which allows the amount of flow, and thus the stagnation pressure may be controlled in the first passage 70a and/or the second passage 70b.

A specific arrangement is described in a second embodiment below. The second embodiment may be the same as the first embodiment except as herein described. In the second embodiment, the shape of the first passage 70a and the shape of the second passage 70b can be configured such that the stagnation pressure of gas exiting the first exit 60a is greater than the stagnation pressure of gas exiting the second exit 60b. This may optionally be in addition to the ways of varying the stagnation pressure at different exits 60a and 60b already described in the first embodiment, or may be as an alternative. Although various different sized passages may be used, the cross-sectional areas of each of the first entrance 65a, first exit 60a, second entrance 65b and second exit 60b may be selected in order to control the stagnation pressure of gas exiting the first passage 70a relative to the stagnation pressure of gas exiting the second passage 70b. Therefore, the sizes of these cross-sectional areas may have some which are the same as each other, or may all be different from each other.

In the second embodiment, a first ratio is the ratio of the first exit to the first entrance, and a second ratio is the ratio of the second exit to the second entrance. The stagnation pressure at the different exits may be controlled by controlling the first ratio relative to the second ratio. In this embodiment, the second ratio is larger than the first ratio. This means that the proportional difference in area between the second exit 60b compared to the second entrance 65b is bigger than the proportional difference in area between the first exit 60a and the first entrance 65a. As will be clear from the description below, this may include variations wherein the cross-sectional area of the second exit 60b and the second entrance 65b is substantially constant or wherein the cross-sectional area between the first exit 60a and the first entrance 65a is substantially constant.

The cross-sectional area of the first entrance 65a, first exit 60a, second entrance 65b and second exit 60b may be any size within reason, as long as the sizes are chosen relative to each other to produce the stagnation pressure variation described above. For example, the diameter of at least one of the first entrance 65a, first exit 60a, second entrance 65b and/or second exit 60b may be greater than or equal to approximately 50 µm, or more preferably approximately 70 µm. The diameter of at least one of the first entrance 65a, first exit 60a, second entrance 65b and/or second exit 60b may be less than or equal to approximately 300 µm, or more preferably approximately 200 µm. The diameter of at least one of the first entrance 65a, first exit 60a, second entrance 65b and/or second exit 60b may be between approximately 50 µm to 300 µm, or more preferably between approximately 70 µm to 200 µm.

In an embodiment, the cross-sectional area of first exit 65a is approximately equal to or less than the cross-sectional area of the first entrance 60a and the cross-sectional area of the second exit 65b is approximately equal to larger than the cross-sectional area of the second entrance 60b. As the second ratio is larger than the first ratio, this means that the first passage 70a may decrease in cross-sectional area from the first entrance 60a to the first exit 65a and the second passage 70b may have substantially the same cross-sectional area of the second entrance 60b and the second exit 65b, or the second passage 70b may increase in cross-sectional area from the second entrance 60b to the second exit 65b, or the cross-sectional area of the first entrance 60a and the first exit 60b is substantially the same and the second passage 70b may increase in cross-sectional area from the second entrance 60b to the second exit 65b.

In the second embodiment, each of the first passages 70a has the first entrance 65a and each of the second passages 70b has the second entrance 65b and the first exit 60a has approximately the same cross-sectional area as the first entrance 65a and the second exit 60b has a larger cross-sectional area than the second entrance 65b. The exits 60 depicted in FIG. 3 may have varying exit sizes, as described such that the stagnation pressure of gas forming the gas knife via the first exits 60a is at a different stagnation pressure to gas forming the gas knife via the second exits 60b. As will be seen from FIG. 4, gas flow through the second passages 70b is expanded as it approaches the second exits 60b, which may thus decrease the stagnation pressure of the gas as it exits the second exits 60b to form the gas knife. FIG. 4 depicts a cross-section of the fluid handling structure 12 along the length of a portion of the gas knife.

The first entrances 65a and the second entrances 65b are in fluid communication with a common manifold and/or are connected to a common gas source. For example, a gas source 75 may provide gas to the first entrances 65a and the second entrances 65b.

The second embodiment is depicted in FIG. 4. FIG. 4 depicts two first passages 70a and two second passages 70b. The number of each of the passages may be much higher.

In this embodiment, the shape and variation of the passages may be formed in many different ways in order to control the relative stagnation pressure of gas exiting the first exit 60a and the second exit 60b. The shape of the passages may affect the gas exiting the gas exits 60, and the internal shape of the passages can be selected to achieve the desired stagnation pressure, or ratio of stagnation pressures between gas exiting the first exit 60a and the second exit 60b.

For example, the second passage 70b may increase in cross-sectional area for the whole length of the second passage 70b. The second passage 70b may stay the same or increase in cross-sectional area for the whole length of the second passage 70b. In other words, the cross-sectional area of the second passage 70b may increase monotonically from the second entrance 65b to the second exit 60b. The cross-sectional area of the second passage 70b may increase linearly with the distance from the second entrance 65b or proportionally to a higher power of that distance. For example, the diameter of the second passage 70b may increase linearly, as depicted in FIGS. 4 and 5. The second passage 70b may form a frustum shape from the second entrance 65b to the second exit 60b.

It may be useful to control the increase in cross-sectional area to avoid gas passing through the second passage 70b from detaching from walls 71b (which may otherwise be referred to as the sides) of the second passage 70b. The flow of gas passing through the first passage 70a and the second passage 70b may be laminar. Controlling the variation of the cross-sectional area may prevent detachment of the laminar gas flow from the walls 71b of the second passage 70b. Detachment of the flow of gas may result in turbulence and loss of efficiency of the gas knife.

Detachment may be reduced or avoided by maintaining the walls 71b of the second passage 70b within a preferred angular range. A close up one of the second passages 70b of FIG. 4 is depicted in FIG. 5. As shown, the second passage 70b may have a second major axis SMA. The second major axis SMA may pass through the center of the cross-sectional area of the second entrance 65b and the center of the cross-sectional area of the second exit 60b. The angle θ of the walls 71b of the second passage 70b may be determined relative to the second major axis SMA through the second passage 70b. The angle θ of sides of the second passage 70b to the second major axis SMA may preferably be between approximately 0.5° and 7°. The angle may be selected to control the stagnation pressure profile of gas exiting the second gas exit 60b. Known techniques of manufacture may be used to create passages with angles of this size, for example, by using ablation technology or Electrical Discharge Machining (EDM).

Alternatively, instead of the cross-sectional area increasing along the length of the second passage 70b (albeit at a constant or varied rate), the second passage 70b may be formed of portions of passage having constant cross-sectional area as depicted in FIG. 6. For example, the second passage 70b may comprise a first portion 72b having a substantially uniform cross-sectional area along the length of the first portion 72b, and a second portion 73b having a substantially uniform cross-sectional area along the length of the second portion 73b. The second portion 73b may have a larger cross-sectional area than the first portion 73a. As shown in FIG. 6, this results in a step shape between the first portion 72b and the second portion 73b.

The second passage 70b may in fact be separated into several small portions, each with a constant cross-sectional area. Although FIG. 6 is depicted with only two portions, any number of portions may be used, as long as the shape of the portions result in the stagnation pressure of gas exiting the second exit 60b to be lower than gas exiting the first exit 60a. For example, as described above, this may mean that the portions increase in cross-sectional area from the second entrance 65b to the second exit 60b. The transitions between portions of constant cross-section may be more gradual than depicted in FIG. 6.

A specific arrangement is described in a third embodiment below. The third embodiment may be the same as the first embodiment except as herein described. In the third embodiment, the shape of the first passage 70a and the shape of the second passage 70b can be configured such that the stagnation pressure of gas exiting the first exit 60a is greater than the stagnation pressure of gas exiting the second exit 60b. This may optionally be in addition to the ways of varying the stagnation pressure at different exits 60a and 60b already described in the first embodiment, or may be as an alternative. Each of the first passages 70a has a first entrance 65a and each of the second passages 70b has a second entrance 65b and the first entrance 65a has a larger cross-sectional area than the first exit 60a and the second exit 60b has approximately the same cross-sectional area as the second entrance 65b. Essentially, this may result in the same stagnation pressure difference between gas exiting the first gas exit 60a and the second gas exit 60b as described above in the second embodiment. However, in this instance, gas flow through the first passage 70a is confined (e.g. restricted) as it approaches the first exit 60a, which may thus increase the stagnation pressure of the gas as it exits the first exit 60a to form the gas knife.

The first entrances 65a and the second entrances 65b are in fluid communication with a common manifold and/or are connected to a common gas source. For example, a gas source 75 may provide gas to the first entrances 65a and the second entrances 65b.

Figure 7:
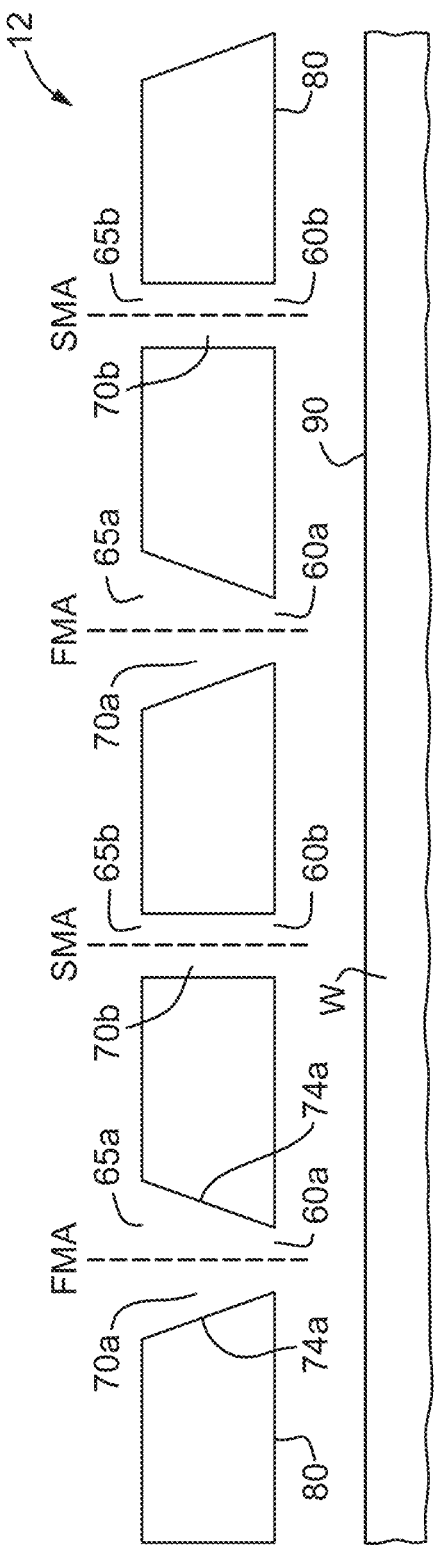
FIG. 7 depicts a cross-section through the fluid handling structure of one of the embodiments, along the length of a portion of the gas knife.

The third embodiment is depicted in FIG. 7. FIG. 7 depicts a cross-section of the fluid handling structure 12 along the length of a portion of the gas knife. FIG. 7 depicts two first passages 70a and two second passages 70b. The number of each of the passages 70 may be much higher.

In this embodiment, the shape and variation of the passages may be formed in many different ways in order to control the relative stagnation pressure of gas exiting the first exit 60a and the second exit 60b. The shape of the passages may affect the gas exiting the gas exits 60, and the internal shape of the passages can be selected to achieve the desired stagnation pressure, or ratio of stagnation pressures between gas exiting the first exit 60a and the second exit 60b.

For example, the first passage 70a may decrease in cross-sectional area for the whole length of the first passage 70a. The cross-sectional area of the first passage 70a may stay the same or decrease in cross-sectional area along the whole length of the first passage 70a. In other words, the cross-sectional area of the first passage 70a may decrease monotonically from the first entrance 65a to the first exit 60a. The cross-sectional area of the first passage 70a may decrease linearly with the distance from the first entrance 65a or proportionally to a higher power of that distance. For example, the diameter of the first passage 70a may decrease linearly, as depicted in FIG. 7. The first passage 70a may form a frustum shape from the first entrance 65a to the first exit 60a.

It may be useful to control the decrease in cross-sectional area to avoid gas passing through the first passage 70a from detaching from walls (which may otherwise be referred to as the sides) of the first passage 70a. The gas passing through the first passage 70a and the second passage 70b may be laminar. Controlling the variation of the cross-sectional area may prevent detachment of the laminar gas flow from the walls 74a of the first passage 70a. Detachment of the flow of gas may result in turbulence and loss of efficiency of the gas knife.

Figure 8:
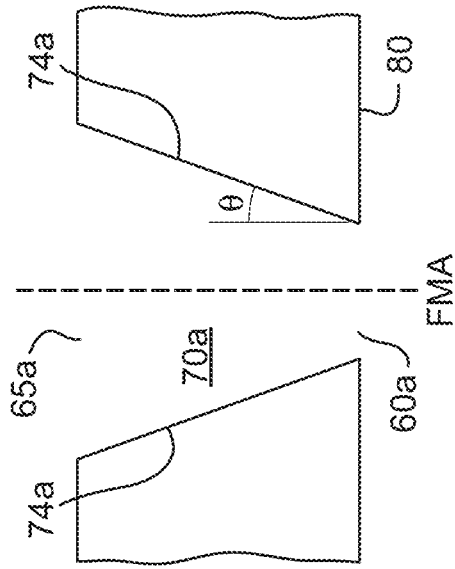
FIG. 8 depicts a close up of a portion of FIG. 7.

Detachment may be reduced or avoided by maintaining the walls 74a of the first passage 70a within a preferred angular range. A close up of one of the first passages 70a of FIG. 7 is depicted in FIG. 8. As shown, the first passage 70a may have a first major axis FMA, as depicted in FIG. 8. The first major axis FMA may pass through the center of the cross-sectional area of the first entrance 65a and the center of the cross-sectional area of the first exit 60a. The angle θ of the walls 74a of the first passage 70a may be determined relative to the first major axis FMA through the first passage 70a. This may be determined in a similar way to as depicted in FIG. 5 for the second embodiment. The angle θ of the sides of the first passage 70a to the first major axis FMA may preferably be greater than or equal to approximately 0.5°. The angle θ may preferably be less than or equal to approximately 30°, or more preferably, less than or equal to approximately 10°. The angle θ may preferably be between approximately 0.5° and 30°, or more preferably, the angle θ may be between approximately 0.5° and 10°. The angle may be selected to control the stagnation pressure profile of gas exiting the first gas exit 60a. Known techniques of manufacture may be used to create passages with angles of this size, for example, by using ablation technology or Electrical Discharge Machining (EDM).

Figure 9:
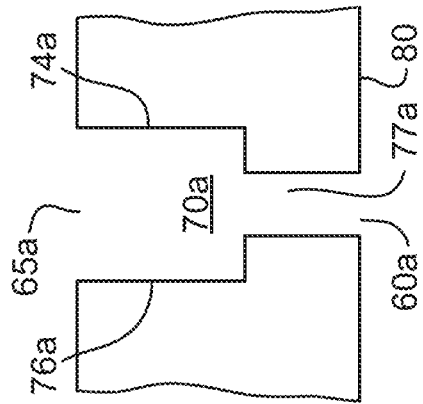
FIG. 9 depicts a variation of the shape of the passage depicted in FIG. 8.

Alternatively, instead of the cross-sectional area decreasing along the length of the first passage 70a (albeit at a constant or varied rate), the first passage 70a may be formed of portions of passage having constant cross-sectional area, as depicted in FIG. 9. This is similar to the variations depicted for FIG. 6 for the second embodiment, except that in the present embodiment, the first passage 70a decreases in size from the first entrance 65a to the first exit 60a. For example, the first passage 70a may comprise a first portion having a substantially uniform cross-sectional area along the length of the first portion, and a second portion having a substantially uniform cross-sectional area along the length of the second portion. The second portion may have a smaller cross-sectional area than the first portion. As shown in FIG. 9, this results in a step shape between the first portion and the second portion.

The first passage 70a may be separated into several small portions, each with a constant cross-sectional area. Although FIG. 9 is depicted with only two portions, any number of portions may be used, as long as the shape of the portions result in the stagnation pressure of gas exiting the second exit 60b to be lower than gas exiting the first exit 60a. For example, as described above, this may mean that the portions decrease in cross-sectional area from the first entrance 65a to the first exit 60a. The transitions between portions of constant cross-section may be more gradual than depicted in FIG. 9.

In a fourth embodiment, the second passage 70b may vary as described in relation to the second embodiment, and the first passage 70a may vary as described in relation to the third embodiment.

Providing strong and soft jets, i.e. using first exits 60a and second exits 60b as described in relation to any of the first to fourth embodiments may allow movement of a droplet of immersion fluid from a position radially outward of the gas knife to a position radially inward of the gas knife and may restrict movement of a droplet of immersion fluid from a position radially inward of the gas knife to a position radially outward. In other words, the shape of at least one first passage 70a and the shape of the at least one second passage 70b may be configured to allow movement of a droplet of immersion fluid from a position radially outward of the gas knife to a position radially inward of the gas knife, and configured to restrict movement of a droplet of immersion fluid from a position radially inward of the gas knife to a position radially outward of the gas knife. Thus, the gas knife formed by first exits 60a and second exits 60b may have the same advantages as described in relation to the at least one exit 200 provided in the further embodiment described below. Particularly, at the advancing side of the fluid handling structure 12, immersion fluid may be allowed to move from a position radially outward of the gas knife to a position radially inward of the gas knife as fluid may pass through the soft jets and at the receding side of the fluid handling structure 12, the strong jets may restrict movement of the immersion fluid from a position radially inward to a position radially outward. The strong jets may reduce film pulling, as described above, compared to if a gas knife in a known apparatus at a lower stagnation pressure without a mix of higher and lower stagnation pressures were used.

In any of the above embodiments, the shape of the first passage 70a and the second passage 70b is not particularly limiting and these passages can be any shape. For example, at least one of the first entrance 65a, first exit 60a, second entrance 65b and/or second exit 60b may be approximately circular in cross-section. Providing a circular shape throughout the first passage 70a and/or the second passage 70b may help reduce or prevent detachment of gas flow from the sides of the first passage 70a and/or second passage 70b respectively.

In any of the above embodiments, the first passage 70a and the second passage 70b may be alternating. In other words, there may be a first passage 70a between two second passages 70b and vice versa. Alternatively, the first passages 70a and the second passages 70b may be provided in a repeating pattern. For example, a single first passage 70a may be provided followed by two second passages 70b, or three second passages 70b, or four second passages 70b and so on, and vice versa. There may be any number of first passages 70a followed by any number of second passages 70b. The number of first passages 70a and second passages 70b may be the same, for example, there may be one first passage 70a followed by one second passage 70b, or two first passages 70a followed by two second passages 70b, or three first passages 70a followed by three second passages 70b and so on. The number of each type of passage may not be the same, for example, there may be two first passages 70a followed by three second passages 70b and so on. The pattern of first passages 70a and second passages 70b may be arranged in a desired manner to provide a desired stagnation pressure variation along the length of the gas knife.

As described above, immersion fluid may be left behind after the fluid handling structure 12 is moved relative to the substrate W. Although varying the stagnation pressure profile of the gas knife as described above may help reduce the immersion fluid left behind, it may be possible to reduce this further by considering the shear stress exerted on the surface of the immersion fluid.

Figure 10:
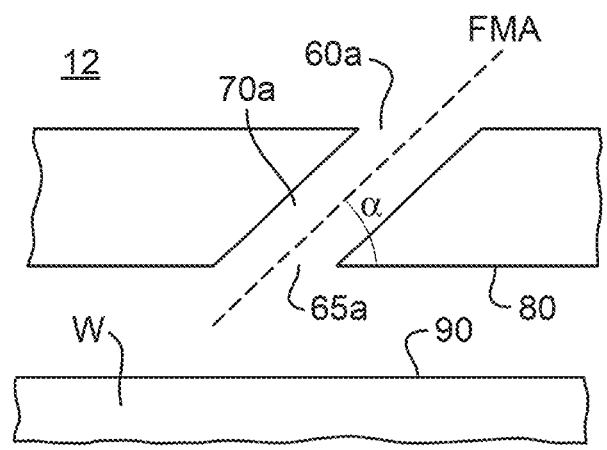
FIG. 10 depicts a close up of a variation of one of the passages depicted in FIGS. 4 to 9.

In any of the above embodiments, the first exit 60a and the second exit 60b are located on a surface 80 of the fluid handling structure 12. The surface 80 may be facing and substantially parallel to a top surface 90 of a substrate W when in use. As described above and as depicted in FIG. 7, the first passage 70a may have a first major axis FMA which passes through the center of the cross-sectional area of the first entrance 65a and first exit 60a and the second passage 70b may have a second major axis SMA which passes through the center of the cross-sectional area of the second entrance 65b and second exit 60b. The first major axis FMA and/or the second major axis SMA may be at an angle to the top surface 90 of the substrate W when in use. This is depicted with respect to the first major axis FMA in FIG. 10. In other words, the first passage 70a and/or the second passage 70b may be at an incline. The angle α may preferably be greater than or equal to approximately 10°, or more preferably approximately 30°. The angle α may preferably be less than or equal to approximately 75°, or more preferably approximately 60°. The angle α may preferably be between approximately 10° to 75°, or more preferably between approximately 30° to 60°.

By providing the first passage 70a and/or the second passage 70b at an incline, the shear stress on the surface of the immersion fluid may increase and there may be an inflow underneath the first exit 60a and/or the second exit 60b. This inflow may have an inward shear stress (possibly a large inward shear stress) which may help droplets of immersion fluid to pass radially inward in the fluid handling structure 12 whilst maintaining the immersion fluid radially inward of the gas knife when in use, i.e. confining the immersion fluid inside the space 11.

Figure 11:
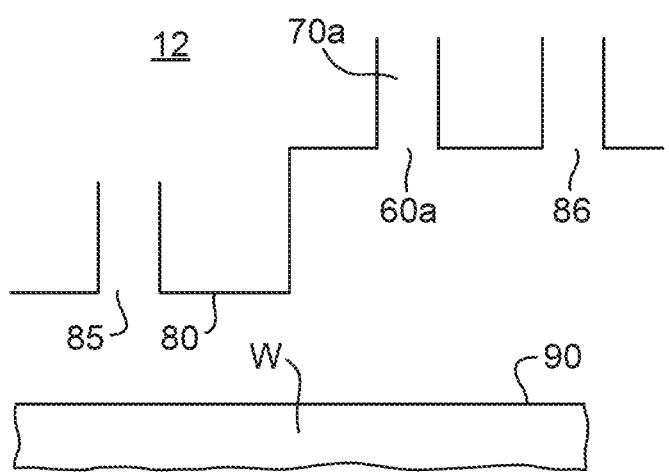
FIG. 11 depicts a cross-section through the fluid handling structure.

In any of the above embodiments, the fluid handling structure 12 may further comprise a fluid extractor radially inward of the gas knife. The fluid extractor may have at least one extractor exit 85. The fluid extractor may be the same as the extractor described in relation to FIG. 3 and the extractor exit 85 may correspond to the openings 50. The extractor exit 85 may be on the same surface 80 of the fluid handling structure 12 as the first exit 60a and the second exit 60b. Being on the same surface means that the extractor exit 85 and the first exit 60a and/or the second exit 60b are both on the same side of the fluid handling structure 12, for example, a side of the fluid handling structure 12 facing the top surface 90 of the substrate W in use. The surface 80 may have variations in height as described below. The surface 80 may connect the extractor exit 85 and the first exit 60a and/or the second exit 60b, for example as a physical part of the fluid handling structure 12 between them. The surface 80 of the fluid handling structure 12 may be facing and substantially parallel to the top surface 90 of the substrate W when in use. There may be a step in the surface 80 such that the first exit 60a and the second exit 60b are at a greater distance from the substrate W than the extractor exit 85 when in use, i.e. the gas knife is elevated. An example is depicted in FIG. 11 which shows a cross section through the extractor exit 85 and one of the first passages 70a. Different cross sections taken at different points along the length of the gas knife may depict the second passage 70b instead of the first passage 70a.

The step may be a vertical step, as depicted in FIG. 11, or it may be angled, i.e. the difference between the parts of the surface 80 at a different height may be angled, i.e. inclined. Alternatively, the step may be curved. Varying the height of the first exit 60a and the second exit 60b may alter the effect of the resulting gas knife on the surface of the substrate W and may help reduce defects. Elevating the gas knife in this way may reduce disturbance forces. The difference in height between the extractor exit 85 and the first exit 60a (and the second exit 60b) may preferably be greater than or equal to approximately 50 μm, or more preferably approximately 100 μm. The difference in height between the extractor exit 85 and the first exit 60a (and the second exit 60b) may preferably be less than or equal to approximately 1000 μm, or more preferably approximately 600 μm. The difference in height between the extractor exit 85 and the first exit 60a (and the second exit 60b) may preferably be between approximately 50 μm to 1000 μm, or more preferably approximately 100 μm to 600 μm.

In any of the above embodiments, a gas supply opening 86 may optionally be provided to supply gas radially outwards of the gas knife. The gas supply opening 86 is depicted in FIG. 11, but may not be present in FIG. 11, or could be present in relation to the description of any of the previous drawings. The gas supply opening 86 may be configured to supply gas to the area adjacent to the gas knife. The gas supply opening 86 may be located at the same distance as the gas knife from the surface 90 of the substrate W as depicted in FIG. 11. In this way, the gas supply opening 86 and the exits (i.e. 60a and 60b) for the gas knife may be at the same distance from the substrate W as the extractor exit 85, or the gas supply opening 86 and the exits (i.e. 60a and 60b) for the gas knife may be at a different distance to the substrate W than the extractor exit 85. The gas supply opening 86 may be supplied at a greater distance from the substrate than the gas knife. This is not depicted. This means that a similar step as described above could be provided between the exits (i.e. 60a and 60b) for the gas knife and the gas supply opening 86. The step may be vertical, angled or curved.

A device manufacturing method may be provided in accordance with any of the above embodiments. A method for manufacturing devices may use a lithographic apparatus comprising any of the above embodiments. For example, a device manufacturing method may comprise a step of projecting a patterned beam of radiation onto a substrate W and the patterned beam of radiation is passed through a region (i.e. a space 11) of immersion fluid. The device manufacturing method may comprise a further step of confining the immersion fluid to the region using a fluid handling structure 12. The fluid handling structure 12 comprises a gas knife system which generates a gas knife radially outward of the region. The device manufacturing method may also comprise a step of using the gas knife system, where the gas knife contributes to the confining step. The gas knife system comprises a series of passages each having an exit. The gas knife may be formed by gas exiting the exits. The passages comprise a plurality of first passages 70a having a plurality of corresponding first exits 60a, and a plurality of second passages 70b having a plurality of corresponding second exits 60b. At least one first passage and at least one second passage are configured such that the stagnation pressure of gas exiting the first exit is greater than the stagnation pressure of the gas exiting the second exit, wherein the plurality of first passages and the plurality of second passages are intermingled and arranged in a line such that the first exits and the second exits form a side of a shape in plan view. The plurality of first passages and the plurality of second passages may form at least one, multiple or all the sides of the shape in plan view.

As described above, it is beneficial to provide a way of reducing or preventing defects by reducing or preventing bulldozing and/or film pulling. A fifth embodiment includes an immersion lithographic apparatus comprising a fluid handling structure 12. The fluid handling structure 12 is configured to confine a flow of immersion fluid to a space 11 (which may otherwise be referred to as a region). The fluid handling structure 12 comprises a gas knife in use. The gas knife may be formed radially outward of the space 11 and may be configured to contribute to confining the immersion fluid. The fluid handling structure comprising at least one exit and the gas knife being formed by gas exiting the at least one exit, wherein the at least one exit is arranged so that the gas knife forms a side of a shape in plan view, wherein the at least one exit has a geometry configured to allow movement of a droplet of immersion fluid from a position radially outward of the gas knife to a position radially inward of the gas knife and is configured to restrict movement of a droplet of immersion fluid from a position radially inward of the gas knife to a position radially outward of the gas knife.

The geometry of the at least one exit forming the side in plan view (forming the gas knife) may therefore be configured to allow movement of a droplet in one direction, and restrict movement of a droplet in another direction. The geometry in plan view (i.e. the shape of the side formed by the at least one exit in plan view) may be configured such that when a droplet of immersion fluid approaches the gas knife from a position radially outward, the geometry may allow movement of the droplet of immersion fluid to a position radially inward of the gas knife. For example, this may occur when the side is the advancing side of the fluid handling structure 12. Additionally, the geometry may be configured such that when a droplet of immersion fluid approaches the gas knife from a position radially inward, the geometry may restrict movement of the droplet of immersion fluid to a position radially outward of the gas knife. For example, this may occur when the side is the receding side of the fluid handling structure 12. Thus, the same side may control the movement of a droplet of immersion fluid to allow and restrict movement depending on whether the side is the advancing side or the receding side of the fluid handling structure 12. In other words, the geometry in plan view may be configured to allow movement of a droplet of immersion fluid as described when it is the advancing side of the fluid handling structure 12, but restrict movement of a droplet of immersion fluid as described when it is the receding side of the fluid handling structure 12.

Allowing movement of a droplet of immersion fluid from a position radially outward of the gas knife to a position radially inward of the gas knife means that if the fluid handling structure 12 approaches a droplet of immersion fluid on the surface of the substrate W, instead of colliding with the droplet and pushing the droplet forwards along the surface of the substrate W (which may cause defects), the droplet may pass through the gas knife into the fluid handling structure 12, thus reducing or preventing the occurrence of defects due to bulldozing. Restricting or preventing movement of a droplet of immersion fluid from a position radially inward of the gas knife to a position radially outward of the gas knife means that less immersion fluid is left on the surface of the substrate W after the fluid handling structure 12 moves relative to it such that the occurrence of defects due to film pulling may be reduced or prevented.

As described above, for previously known apparatus, it is known that increasing the stagnation pressure of the gas knife may reduce the film pulling, however, this can have an adverse effect on bulldozing. Therefore, increase of the stagnation pressure of the gas knife may be limited and a balance of higher stagnation pressure and lower stagnation pressure needs to be reached. The present embodiment may reduce the bulldozing at the advancing side of the fluid handling structure 12 (by allowing droplets to move radially inward) to such an extent that higher stagnation pressure can still be used at the receding side of the fluid handling structure 12 than could otherwise be implemented with previously known apparatus. Therefore, higher stagnation pressure can be provided and this can reduce film pulling at the receding side of the fluid handling structure 12 whilst minimizing or maintaining bulldozing effects at the advancing side of the fluid handling structure 12 as compared to using known apparatus. These advantages can be achieved by providing one gap 210 on the advancing side (i.e. multiple gaps may be provided but aren't required) because a single gap on the advancing side may reduce bulldozing, and the reduction in bulldozing may allow an increase in the overall stagnation pressure used for the gas knife such that film pulling may be reduced on the receding side due to the increased stagnation pressure. However, having a geometry with multiple gaps 210 may improve the advantages provided. For example, there is an advantage to having at least one gap 210 on each side of the shape in plan view such that these advantages can be achieved irrespective of the direction of movement of the fluid handling structure 12 (i.e. when the fluid handling moves in any direction, there will be a gap 210 on the advancing side).

The gas knife having the geometry described in the fifth embodiment may have the same advantages as the soft and strong jets in the first to fourth embodiment. In more detail, in the first to fourth embodiments, droplets may pass radially inward of the gas knife due to the soft jets on the advancing side, and providing a gap 210 on an advancing side of the fluid handling structure 12 would allow movement of a droplet of immersion fluid from a position radially outward of the gas knife to a position radially inward of the gas knife providing the same advantages relating to reducing bulldozing. Furthermore, in the first to fourth embodiments, droplets may be prevented from moving radially outward of the gas knife by the strong jets on the receding side, and the gas knife can be at a higher stagnation pressure when gaps 210 are provided as described above which restricts movement of a droplet of immersion fluid from a position radially inward of the gas knife to a position radially outward of the gas knife and thus provides the same advantages relating to reduced film pulling. Furthermore, an advantage of the gap 210 being provided using the geometry as herein described is that although the gap 210 allows entry of droplets when on the advancing side, the gap 210 can still prevent or restrict movement of droplets outwards when on the receding side. Thus, film pulling can be reduced or prevented when the gap 210 is provided on a receding side.

Known fluid handling structures generally have exits wherein gas exiting the exits form the gas knife. Generally, it is known that a gas knife is formed by exits which are in a straight line or form a continuous shape. In the fifth embodiment, the geometry of the at least one exit (i.e. the geometry of the side of the shape in plan view) is configured in such a way as to provide a layout which allows movement of a droplet of immersion fluid from a position radially outward of the gas knife to a position radially inward of the gas knife and is configured to restrict movement of a droplet of immersion fluid from a position radially inward of the gas knife to a position radially outward of the gas knife. In other words, the configuration of the side in plan view provides this function.

More specifically, the fluid handling structure 12 comprises at least one exit 200 and the gas knife may be formed by gas exiting the at least one exit 200. The at least one exit 200 is arranged so that the gas knife forms a shape in plan view, or more specifically, the sides of a shape in plan view. For example, the shape may be similar to the shape depicted in FIG. 3, and the at least one exit 200 may correspond to the exits 60 depicted in FIG. 3. It is noted that the exits 200 referred to in the fifth embodiment may or may not have passages shaped as described in relation to the first, second, third and/or fourth embodiments. Either way, the gas knife may form a variety of shapes due to the geometry of the at least one exit 200.

Figure 12A:
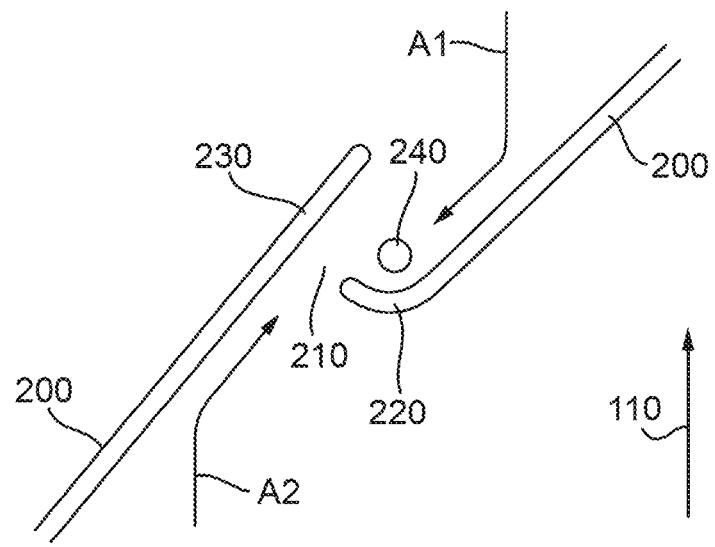
FIGS. 12A and 12B show a portion of the fluid handling structure in plan view in accordance with one of the embodiments.

In the fifth embodiment, a gap 210 may be formed along at least one of the sides of the shape in plan view. (This gap is not depicted in FIG. 3.) The gap 210 is shown in FIG. 12A. FIG. 12A is a close up of at least a portion of one of the sides of the shape. For example, FIG. 12A could depict a close up of at least a portion of the bottom right hand side of the four pointed star shape in FIG. 3, although altered to include a gap 210. The gap 210 is configured to allow movement of a droplet of immersion fluid from a position radially outward of the gas knife to a position radially inward of the gas knife. For example, the gap 210 may provide an opening where droplets on the surface of the substrate W which collide with the fluid handling structure 12 at the advancing side of fluid handling structure 12 may pass under the fluid handling structure 12 and may enter the space 11. The possible movement of such a droplet is indicated by arrow A2 in FIG. 12A. As the fluid handling structure 12 reaches a droplet of immersion fluid which is radially outward of the gas knife, the droplet may move along the edge of the gas knife due to the relative movement and when the droplet reaches the gap 210, the droplet may move inwards of the gas knife.

There may be multiple gaps 210 formed along at least one of the sides of the shape in plan view. There may be at least one gap 210 on more than one side. If gaps 210 are formed on other sides, the shape of the at least one exit 200 at the gap 210 may be mirrored or rotated to provide the same effect at different parts of the gas knife. In an example, the shape formed by the gas knife is a four pointed star as depicted in FIG. 3, and there are multiple gaps 210 formed on each side. The number of gaps 210 on each side may be the same. There may be any number of gaps 210 which is practical, for example, there may be 1, 2, 3, 4, 5, 6, 7, 8, 9, or more gaps 210 on each side.

When relative movement between the substrate W and the fluid handling structure 12 is in a direction such that the side is the advancing side of the fluid handling structure 12, then a droplet of immersion fluid ahead of the side is pushed along the edge of the gas knife, which can create defects (i.e. bulldozing). The gap 210 allows the droplet of immersion fluid to pass from a position outward of the gas knife to a position inward of the gas knife to reduce bulldozing. The distance between a point where the droplet of immersion fluid reaches the gas knife and the gap 210 which allows the droplet to move inwards is called the mean droplet distance. Before passing through the gap 210, the movement of the droplet along the edge of the gas knife may still lead to bulldozing. It may be beneficial to provide multiple gaps 210 along the same side. The mean droplet distance may be optimized, i.e., being large enough to catch droplets of immersion fluid, so as to reduce bulldozing.

The gap 210 may be between approximately 200 µm to 1000 µm. These are exemplary values and the size of the gap 210 may be selected from any reasonable value to optimize the likelihood of allowing immersion fluid to enter radially inwards of the gas knife.

At least a portion of the side comprising the gap 210 may comprise two end portions 220, 230 along that side and the gap 210 may be formed between the two end portions 220, 230 of the at least one exit 200. The two end portions 220, 230 may form at least a part of the shape. Out of the two end portions, a first end portion 220 may comprise a bend. The bend may be a curved portion as depicted in FIG. 12A. The first end portion 220 may be configured to restrict movement of a droplet of immersion fluid left behind from a position radially inward of the gas knife to a position radially outward of the gas knife at the receding side of the fluid handling structure 12. The possible movement of such a droplet is indicated by arrow A1 in FIG. 12A. This droplet movement may occur when the substrate W is moved relative to the fluid handling structure 12 in a direction opposite to a scanning direction, wherein the scanning direction is depicted by arrow 110 in FIG. 12A. The first end portion 220 may only be slightly curved, as depicted in FIG. 12A. The first end portion 220 may be more curved and may form a U-shape or a hook shape. The first end portion 220 may be straight, but the end may be at an angle to the rest of that part of the opening. In other words, the first end portion 220 may comprise a bend between two straight portions.

If there are multiple gaps 210, there may be multiple end portions 220, 230, and in particular multiple end portions 220 each comprising a bend.

The first end portion 220 is positioned such that if a droplet of immersion fluid is to pass outward from the fluid handling structure 12, the droplet will encounter part of the gas knife and will be collected in the first end portion 220. The first end portion 220 may either collect the droplets of immersion fluid and/or redirect them. The fluid handling structure 12 may optionally comprise a droplet extractor 240 to remove droplets which have been rounded up by the first end portion 220. The droplet extractor 240 may be the similar to the extractor described above in relation to FIG. 3. For example, the droplet extractor 240 may be a dual phase extractor. Although the droplet extractor 240 is depicted in FIG. 12A, this is optional and may be provided in further drawings, e.g. FIG. 12B. There may be multiple first end portions 220. There may be the same number of first end portions 220 as there are gaps 210.

The other of the two end portions may optionally be a straight end portion 230. This may be advantageous for allowing droplets to enter inwards of the gas knife, for example, following movement A2 in FIG. 12A when the substrate W is travelling relative to the fluid handling structure 12 in the scanning direction 110. This allows droplets to enter inward of the gas knife at the advancing side of the fluid handling structure 12.

In the fifth embodiment, when in use, the substrate W may be moved relative to the fluid handling structure 12 in the scanning direction 110. A portion of the shape of at least one opening 200 may overlap with the other portion of at least one opening 200. For example, in a plane perpendicular to the scanning direction 110, one of the end portions 230 or 220 may be positioned to overlap with the other end portion 220 or 230. This may mean that there is no gap in a plane perpendicular to the scanning direction 110. In other words, in the scanning direction 110 (i.e. if viewed along the scanning direction), there is no gap between the tip of each of the end portions 220 and 230. In other words, in the scanning direction 110, the end portions 220 and 230 overlap with each other, i.e. if viewed in the scanning direction 110 in FIG. 12A.

Having an overlap, i.e. no gap along the scanning direction 110, means that if a droplet is inwards of the gas knife, and the fluid handling structure 12 is moving along the scanning direction 110, no matter where the droplet is located, it will encounter the gas knife. As long as the substrate W moves relative to the fluid handling structure 12 parallel to the scanning direction 110, then droplets are likely to move relative to the fluid handling structure 12 parallel to the scanning direction 110 and would thus reach a part of the gas knife, for example, as formed by the end portions 230 or 220. This helps restrict or even prevent movement of a droplet of immersion fluid from a position radially inward of the gas knife to a position radially outward of the gas knife.

FIG. 12A depicts the at least one exit 200 as slits. For example, the shape formed by the at least one exit 200 may be a continuous shape with the gap 210 as depicted in FIG. 12A. The at least one exit 200 may be formed as a slit (i.e. a continuous groove) in the fluid handling structure 12 through which gas exits. Alternatively, at least part of the gas knife may be formed by gas exiting a plurality of exits. If the at least one opening 200 is formed by a slit, the shape in plan view may be formed by one continuous slit with a gap 210 being formed on only one side. Therefore, when the fluid handling structure 12 is oriented such that the gap 210 is on an advancing side, the geometry is configured to allow movement of a droplet of immersion fluid radially inward of the gas knife, whereas when the fluid handling structure 12 is oriented such that the gap 210 is on a receding side, the geometry is configured to restrict movement of a droplet of immersion fluid radially outward of the gas knife. The gap 210 may be formed between a first end of the slit and a second end of a slit. For example, the shape formed by the at least one exit 200 as a substantially continuous slit may be a rhombus, but along one side of the shape, the gap 210 may be formed between two ends of the slit, such as those depicted in FIG. 12A.

Figure 12B:
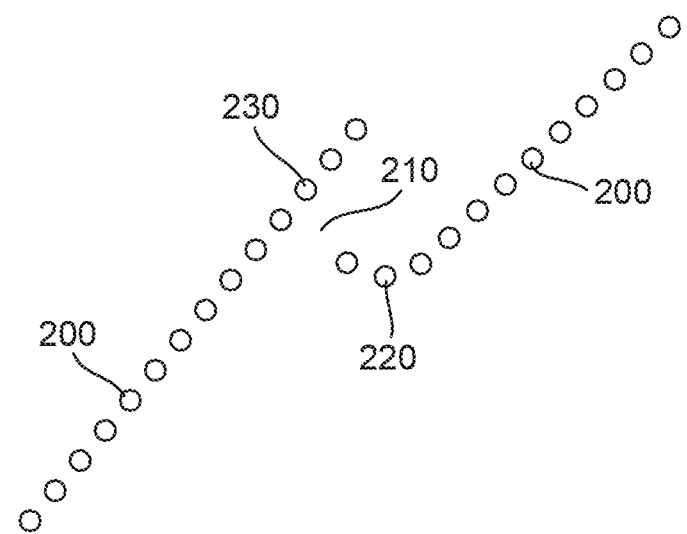

For example, the at least one exit 200 may be many discrete openings as depicted in FIG. 12B. The gas exits the openings to form the gas knife in the same way as described above. Although the openings are depicted as circular, they could be any shape and this is not particularly limiting. If the gas knife is formed by a plurality of openings, the gap 210 may be wider than the distance between the edges of two adjacent openings. The gap 210 may be greater than 1 times the distance between the edges of two adjacent openings. The gap may be up to approximately 5 times the distance between the edges of two adjacent openings.

In the fifth embodiment, instead of, or as well as providing the geometry described above, the at least one exit 200 may comprise a plurality of discrete openings and the distance between each of the openings and the size of each of the openings may be selected and varied in order to allow movement of a droplet of immersion fluid from a position radially outward of the gas knife to a position radially inward of the gas knife and is configured to restrict movement of a droplet of immersion fluid from a position radially inward of the gas knife to a position radially outward of the gas knife, e.g., depending on whether the side is the advancing side or the receding side of the fluid handling structure 12. For example, the at least one exit 200 may be replaced with the first exit 60a and the second exit 60b as described above.

In the fifth embodiment, as described above, immersion fluid may be left behind at the receding side of the fluid handling structure 12 after the fluid handling structure 12 is moved relative to the substrate W. Although varying the stagnation pressure of the gas knife as described above may help reduce the immersion fluid left behind, it may be possible to reduce this further by considering the shear stress exerted on the surface of the immersion fluid.

Figure 13:
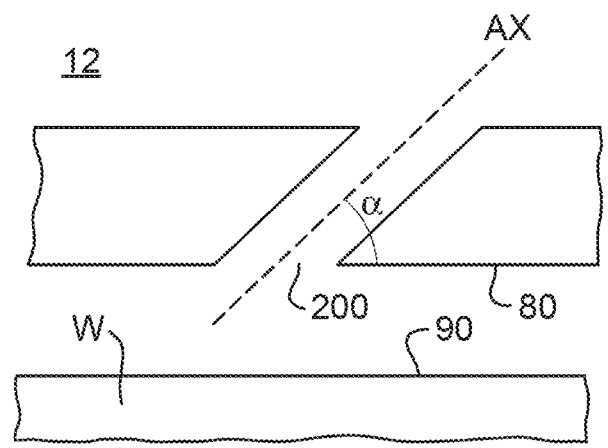
FIG. 13 depicts a close up of a variation of one of the passages depicted in FIGS. 12A and 12B.

In the fifth embodiment, the at least one exit 200 is located on a surface of the fluid handling structure 12, which may be similar to the surface 80 depicted in FIGS. 8 and 9. The surface 80 may be facing and substantially parallel to the top surface 90 of the substrate W when in use as depicted in FIG. 13. The at least one exit 200 may have a major axis which passes through the center of the cross-sectional area of the at least one exit 200. The major axis of the at least one exit 200 may be at an angle to the top surface 90 of the substrate W when in use. This may appear in cross section to be the same as FIG. 10 except that the first passage 70a is replaced with the at least one exit 200. In other words, the at least one exit 200 may be at an incline. The angle α may preferably be greater than or equal to approximately 10°, or more preferably approximately 30°. The angle α may preferably be less than or equal to approximately 75°, or more preferably approximately 60°. The angle α may preferably be between approximately 10° to 75°, or more preferably between approximately 30° to 60°.

By providing the at least one exit 200 at an incline, the shear stress on the surface of the immersion fluid may increase and there may be an inflow underneath the at least one exit 200. This inflow may have an inward shear stress (possibly a large inward shear stress) which may help droplets of immersion fluid to pass radially inward in the fluid handling structure 12 when on the advancing side and maintaining the immersion fluid radially inward of the gas knife when in use when on the receding side, i.e., confining the immersion fluid inside the space 11 and restricting movement of a droplet of immersion fluid radially outward of the gas knife.

Figure 14:
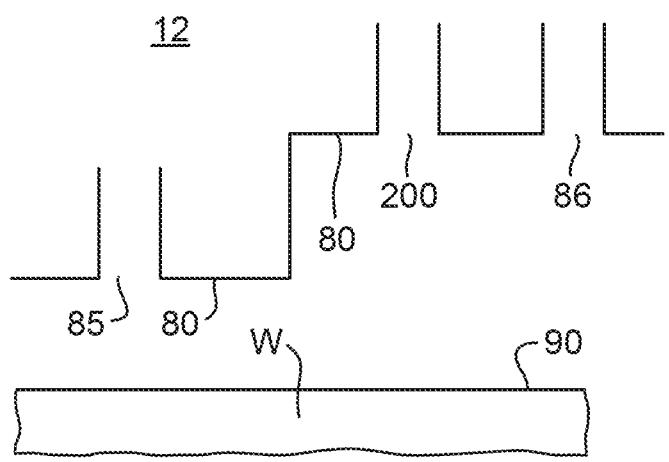
FIG. 14 depicts a cross-section through the fluid handling structure.

In the fifth embodiment, the fluid handling structure 12 may further comprise a fluid extractor radially inward of the gas knife. The fluid extractor may have at least one extractor exit 85. The fluid extractor may be the same as the extractor described in relation to FIG. 3 and the extractor exit 85 may correspond to the openings 50. The extractor exit 85 may be on the same surface 80 of the fluid handling structure 12 as the at least one exit 200. An example is depicted in FIG. 14 which shows a cross-section through the extractor exit 85 and the at least one exit 200. As can be seen, this may appear in cross section to be the same as FIG. 11 as described above, except that the first passage 70a (and the second passage 70b) is replaced with the at least one exit 200. Being on the same surface 80 means that the extractor exit 85 and the at least one exit 200 are both on the same side of the fluid handling structure 12, for example, a side of the fluid handling structure 12 facing the top surface 90 of the substrate W in use. The surface 80 may have variations in height as described below. The surface 80 may provide a connection between the extractor exit 85 and the first exit 60a and/or the second exit 60b. In other words, the extractor exit 85, the first exit 60a and/or the second exit 60b may be provided on the same surface 80 which is a continuous surface on one component of the fluid handling structure 12. The surface 80 of the fluid handling structure 12 may be facing and substantially parallel to the top surface 90 of the substrate W when in use. There may be a step in the surface 80 such that the at least one exit 200 is at a greater distance from the substrate W than the extractor exit 85 when in use, i.e. the gas knife is elevated.

The step may be a vertical step as depicted in FIG. 14, or it may be angled, i.e. the difference between the parts of the surface 80 at a different height may be angled, i.e. inclined. Alternatively, the step may be curved. Varying the height of the at least one exit 200 may alter the effect of the resulting gas knife on the surface of the substrate W and may help reduce defects. Elevating the gas knife in this way may reduce disturbance forces. The difference in height between the extractor exit 85 and the at least one exit 200 may preferably be greater than or equal to approximately 50 μm, or more preferably approximately 100 μm. The difference in height between the extractor exit 85 and the at least one exit 200 may preferably be less than or equal to approximately 1000 μm, or more preferably approximately 600 μm. The difference in height between the extractor exit 85 and the at least one exit 200 may preferably be between approximately 50 μm to 1000 μm, or more preferably approximately 100 μm to 600 μm.

In the fifth embodiment, a gas supply opening 86 may optionally be provided to supply gas radially outwards of the gas knife. A gas supply opening 86 may be provided outward of the gas knife. The gas supply opening 86 may or may not be provided with any variation of the fifth embodiment. The gas supply opening 86 may be configured to supply gas to the area adjacent to the gas knife. The gas supply opening 86 may be located at the same distance as the gas knife from the top surface 90 of the substrate W as depicted in FIG. 14. As can be seen, FIG. 14 is substantially the same as FIG. 11 as described above, except that the first passage 70a (and the second passage 70b) is replaced with the at least one exit 200. In this way, the gas supply opening 86 and the at least one exit 200 may be at the same distance from the substrate W as the extractor exit 85, or the gas supply opening 86 and the at least one exit 200 may be at a different distance to the substrate W than the extractor exit 85. The gas supply opening 86 may be supplied at a greater distance from the substrate W than the gas knife. This is not depicted. This means that a similar step as described above could be provided between the at least one exit 200 and the gas supply opening 86. The step may be vertical, angled or curved.

A device manufacturing method may be provided in accordance with the fifth embodiment. A method for manufacturing devices may use a lithographic apparatus comprising any variation relating to the fifth embodiment. For example, a device manufacturing method may comprise projecting a patterned beam of radiation onto a substrate, wherein the patterned beam of radiation is passed through a region of immersion fluid, confining the immersion fluid to the region using a fluid handling structure of an immersion system, wherein the fluid handling structure comprises a gas knife system, and generating a gas knife radially outward of the region, using the gas knife system, wherein the gas knife contributes to the confining step, and the fluid handling structure comprising at least one exit and the gas knife being formed by gas exiting the at least one exit, wherein the at least one exit is arranged so that the gas knife forms sides of a shape in plan view, wherein the at least one exit has a geometry configured to allow movement of a droplet of immersion fluid from a position radially outward of the gas knife to a position radially inward of the gas knife and configured to restrict movement of a droplet of immersion fluid from a position radially inward of the gas knife to a position radially outward of the gas knife.

A further device manufacturing method may comprise projecting a patterned beam of radiation onto a substrate, wherein the patterned beam of radiation is passed through a region of immersion fluid, confining the immersion fluid to the region using a fluid handling structure of an immersion system, wherein the fluid handling structure comprises a gas knife system, and generating a gas knife radially outward of the region, wherein the fluid handling structure comprises at least one exit, the at least one exit being arranged so as to form the gas knife forming a side of a shape in plan view wherein the side comprises two end portions along that side and a gap is formed between the two end portions along that side of the shape in plan view, and one of the end portions comprising bent end portion, and wherein in use, a substrate is moved relative to the fluid handling structure in a scanning direction, and the shape overlaps with itself such that the gap is not visible in a plane perpendicular the scanning direction.

It is noted that any variation of the fifth embodiment may be used in combination with any variation described above, and in particular, with any of the first, second, third and/or fourth embodiments. For example, the first exit 60a and the second exit 60b may be used to provide the at least one exit 200.

In any of the above embodiments, at least one additional gas outlet 300 may be provided as depicted in FIG. 15. FIG. 15 is the same as FIG. 3 except for the multiple additional gas outlets 300. The at least one additional gas outlet 300 may be provided with any of the above described embodiments, for example with any of the first to fourth embodiments as will be described herein. The at least one additional gas outlet 300 may be located between the meniscus controlling feature (as depicted by the discrete openings 50 in FIG. 15) and the gas knife. In relation to the first to fourth embodiments, this may be between the meniscus controlling feature and the exits 60. In this context the word "between" means radially outward of the meniscus controlling feature, and radially inward of the exits 60.

As previously described, the substrate W may be moved relative to the fluid handling structure 12, immersion fluid may be dragged behind the fluid handling structure 12, e.g., at the receding side of the fluid handling structure 12. When the meniscus of the immersion fluid breaks over the surface of the substrate W, a fluid film is left on the substrate W. The film retracts over the whole length of a trailing/receding side of the fluid handling structure 12. The retracting film will break up into droplets on substrate W in a triangular pattern. The trailing side(s) may be any side of the fluid handling structure 12 depending on the relative movement of the substrate W. The trailing side may be changed if the direction of relative movement between the substrate W and the fluid handling structure 12 is changed. These immersion fluid droplets may lead to watermark defects as described above. However, it has been found that providing dry spots along the length of the trailing side of the fluid handling structure 12 may help reduce the watermark defects resulting from the retraction of the immersion fluid film.

As mentioned, the at least one additional gas outlet 300 may be used to provide gas between the meniscus controlling feature and the gas knife. The additional gas outlet 300 may be a discrete opening used to provide gas. For example, the gas provided by the at least one additional gas outlet 300 may be $CO_2$ gas. The gas may be provided to create local dry spots along the length of a trailing side of the fluid handling structure 12. The stagnation pressure of gas exiting the additional gas outlet 300 may be approximately the same as, or greater than, the stagnation pressure of gas exiting the exits 60 forming the gas knife in use.

By creating or promoting dry spots, the film may be broken up into smaller, separate films along the length of the trailing side of the fluid handling structure 12. The smaller, separate films may retract from several positions along the length of the trailing side of the fluid handling structure 12 rather than retracting over the full length of the trailing side of the fluid handling structure 12. Retracting in several smaller portions may result in the droplets forming smaller retraction triangular patterns on the surface of the substrate W. This may therefore decrease the overall amount of immersion fluid and/or the number of droplets left on the surface of the substrate W. In other words, the overall amount of immersion fluid in the smaller triangular patterns is less than it would otherwise be if a larger triangular pattern of droplets was formed from the film retracting along the entire length of the trailing side of the fluid handling structure 12. Thus, the at least one additional gas outlet 300 may be provided to promote drying spots between the meniscus controlling feature and the gas knife to reduce immersion fluid left on the substrate W.

It may be possible to create this effect using only one additional outlet 300. For example, placing one additional gas outlet 300 along the trailing side of the fluid handling structure 12 may mean that the immersion fluid retracts in two separate film portions rather than one. The additional gas outlet 300 may preferably be located to separate the length of the trailing side of the fluid handling structure 12 into equal portions. For example, an additional gas outlet 300 may be provided in an approximately central location along the trailing side of the fluid handling structure 12. Alternatively, more than one additional gas outlet 300 may be provided. For example, one additional gas outlet 300 on multiple sides, or per side, of the fluid handling structure 12 may be provided. 1, 2, 3, 4, 5, 6, 7, 8, 9, 10 etc. or up to 50 or even more additional gas outlets 300 may be provided on at least one, multiple or all sides. There may be different numbers of additional gas outlets 300 on different sides of the fluid handling structure 12, or at least two sides may have the same number of additional gas outlets 300 as each other. The number of additional gas outlets 300 is not particularly limiting, and any appropriate number may be used. Having a larger number of additional gas outlets 300 means that the amount of immersion fluid left behind on the substrate W may be further reduced and the area over which the remaining immersion fluid is left behind on the substrate W may be located towards the outer edge of the substrate W.

The pitch may be determined as the distance from the center of one additional gas outlet 300 to the center of an adjacent additional gas outlet 300. This is likely to be determined along a single side of the fluid handling structure 12. The pitch may be between approximately 20 to 100 times larger than the pitch between adjacent exits 60. The pitch may be greater than or equal to approximately 1 mm. The maximum pitch may be defined by the length of a side of the fluid handling structure 12 in which only one additional gas outlet 300 is provided. In other words, if only one additional gas outlet 300 is provided along one side, the maximum pitch is not greater than the length of one side. As an example, if the additional gas outlet 300 is provided in the middle of a side, the pitch will be half the length of the side. Additionally, the length of the film pulling time will decrease as the number of additional gas outlets 300 are provided along the trailing side. The film pulling time may be the time during which the gas knife loses water droplets outward onto the substrate W. This stops when the fluid starts to retract between the gas knife and the meniscus controlling feature. The pitch may be selected depending on estimated or measured formation of immersion fluid droplets on the surface of the substrate W.

Although not depicted, at least one additional gas outlet 300 may be provided with the fifth embodiment. This may be substantially the same as described above except that the additional gas outlet 300 may be provided between the extractor exit 85 (which may correspond to the meniscus controlling feature) and the at least one exit 200 (to replace the exits 60 described above). In this context the word "between" means radially outward of the meniscus controlling feature, and radially inward of the at least one exit 200.

In an embodiment, there is provided an immersion lithographic apparatus comprising a fluid handling structure, the fluid handling structure configured to confine immersion fluid to a region and comprising a gas knife system, the gas knife system comprising passages each having an exit, the passages comprising a plurality of first passages having a plurality of corresponding first exits, and a plurality of second passages having a plurality of corresponding second exits, wherein at least one first passage and at least one second passage are configured such that the stagnation pressure of gas exiting the first exit is greater than the stagnation pressure of gas exiting the second exit, and the plurality of first passages and the plurality of second passages are intermingled and arranged in a line such that the first exits and the second exits form a side of a shape in plan view.

In an embodiment, the at least one first passage has a first entrance and the at least one second passage has a second entrance and a first ratio is the ratio of the corresponding first exit to the first entrance, and a second ratio is the ratio of the corresponding second exit to the second entrance, and the second ratio is larger than the first ratio. In an embodiment, the cross-sectional area of the first exit is approximately equal to or less than the cross-sectional area of the corresponding first entrance and the cross-sectional area of the second exits is approximately equal to or larger than the cross-sectional area of the corresponding second entrance. In an embodiment, the cross-sectional area of the second passage increases monotonically from the second entrance to the second exit. In an embodiment, the second passage forms a frustum shape from the second entrance to the second exit. In an embodiment, the angle of sides of the second passage to a major axis through the passage is between approximately 0.5° and 7°. In an embodiment, the second passage comprises a first portion having a substantially uniform cross-sectional area along the length of the first portion, and a second portion having a substantially uniform cross-sectional area along the length of the second portion, wherein the second portion has a larger cross-sectional area than the first portion. In an embodiment, the first passage has the first entrance and the second passage has the second entrance and the first entrance has a larger cross-sectional area than the first exit and the second exit has approximately the same cross-sectional area as the second entrance. In an embodiment, the cross-sectional area of the first passage decreases monotonically from the first entrance to the first exit. In an embodiment, the first passage forms a frustum shape from the first exit to the first entrance. In an embodiment, the angle of sides of the second passage to a major axis through the passage is between approximately 0.5° and 30°, or more preferably, between approximately 0.5° and 10°. In an embodiment, the first passage comprises a first portion having a substantially uniform cross-sectional area along the length of the first portion, and a second portion having a substantially uniform cross-sectional area along the length of the second portion, wherein the second portion has a larger cross-sectional area than the first portion. In an embodiment, the first exit and the second exit are located on a surface of the fluid handling structure, the surface facing and being substantially parallel to a top surface of a substrate when in use, and the first passage has a first major axis which passes through the center of the cross-sectional area of the first entrance and first exit and the second passage has a second major axis which passes through the center of the cross-sectional area of the second entrance and second exit, wherein the first major axis and/or the second major axis is at an angle to the top surface of a substrate when in use, wherein the angle is preferably between approximately 10° to 75°, or more preferably between approximately 30° to 60°. In an embodiment, the fluid handling structure further comprises a fluid extractor radially inward of the gas knife, the fluid extractor having an extractor exit on a surface of the fluid handling structure as the first exit and the second exit, the surface facing and being substantially parallel to a top surface of a substrate when in use, wherein there is a step in the surface such that the first exit and the second exit are at a greater distance from the substrate than the extractor exit when in use.

In an embodiment, there is provided a device manufacturing method comprising: projecting a patterned beam of radiation onto a substrate, wherein the patterned beam of radiation is passed through a region of immersion fluid; confining the immersion fluid to the region using a fluid handling structure, wherein the fluid handling structure comprises a gas knife system; and generating a gas knife radially outward of the region, using the gas knife system, wherein the gas knife contributes to the confining step, and wherein the gas knife system comprises passages each having an exit, the passages comprising a plurality of first passages having a plurality of corresponding first exits, and a plurality of second passages having a plurality of corresponding second exits, wherein at least one first passage and at least one second passage are configured such that the stagnation pressure of gas exiting the first exit is greater than the stagnation pressure of gas exiting the second exit, and the plurality of first passages and the plurality of second passages are intermingled and arranged in a line such that the first exits and the second exits form a side of a shape in plan view.

Although specific reference may be made in this text to the use of lithographic apparatus in the manufacture of integrated circuits, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate W referred to herein may be processed, before or after exposure, in for example a track (a tool that typically applies a layer of resist to a substrate W and develops the exposed resist), a metrology tool and/or an inspection tool. Where applicable, the disclosure herein may be applied to such and other substrate processing tools. Further, the substrate W may be processed more than once, for example in order to create a multi-layer integrated circuit, so that the term substrate W used herein may also refer to a substrate W that already contains multiple processed layers.

In any of the embodiments, the gas used for the gas knife and/or supplied by the gas supply opening may be ay suitable gas. Optimally, the gas comprises $CO_2$, or is pure $CO_2$.

The terms "radiation" and "beam" used herein encompass all types of electromagnetic radiation, including ultraviolet (UV) radiation (e.g. having a wavelength of or about 365, 248, 193, 157 or 126 nm). The term "lens", where the context allows, may refer to any one or combination of various types of optical components, including refractive and reflective optical components.

While specific embodiments of the invention have been described above, it will be appreciated that the invention may be practiced otherwise than as described.

One or more embodiments of the invention may be used in a device manufacturing method.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more fluid openings including one or more liquid openings, one or more gas openings or one or more openings for dual phase flow. The openings may each be an inlet into the immersion space (or an outlet from a fluid handling structure) or an outlet out of the immersion space (or an inlet into the fluid handling structure). In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The descriptions above are intended to be illustrative, not limiting. Thus, it will be apparent to one skilled in the art that modifications may be made to the invention as described without departing from the scope of the claims set out below.

The invention claimed is:

1. A fluid handling structure configured to confine immersion fluid to a region in an immersion lithographic apparatus and comprising:
   a gas knife system comprising a plurality of passages, the passages comprising:
      a plurality of first passages having a plurality of corresponding first exits, on a surface of the fluid handling structure, to supply gas out of the fluid handling structure to the region, and
      a plurality of second passages having a plurality of corresponding second exits, outwards of the first exits on the surface of the fluid handling structure, to supply gas out of the fluid handling structure to the region,
   wherein at least one first passage is partly defined by a side wall that is inclined in a manner such that an angle of the side wall of the first passage to the vertical is between 0.5° and 30°.

2. The fluid handling structure of claim 1, wherein the angle of the side wall of the first passage to the vertical is between 0.5° and 10°.

3. The fluid handling structure of claim 1, wherein at least one second passage is partly defined by a side wall that is inclined in a manner such that an angle of the side wall of the second passage to the vertical is between 0.5° and 7°.

4. The fluid handling structure of claim 1, wherein at least one first passage of the plurality of first passages has a first entrance and at least one second passage of the plurality of second passages has a second entrance and a first ratio is a ratio of a dimension of the first exit to a dimension of the corresponding first entrance, and a second ratio is a ratio of a dimension of the second exit to a dimension of the corresponding second entrance, and the second ratio is larger than the first ratio.

5. The fluid handling structure of claim 1, configured such that a flow of gas passing through at least one first passage of the plurality of first passages and at least one second passage of the plurality of second passages is laminar.

6. The fluid handling structure of claim 1, configured such that a stagnation pressure of gas exiting a first exit of the first exits is greater than a stagnation pressure of gas exiting a second exit of the second exits.

7. The fluid handling structure of claim 1, further comprising a meniscus controlling feature having an extractor exit on the surface of the fluid handling structure, wherein the surface faces and is substantially parallel to a top surface of a substrate during exposure, and a first exit of the first exits and a second exit of the second exits are arranged at a greater distance from the substrate than the extractor exit.

8. The fluid handling structure of claim 7, further comprising at least one additional gas outlet between the meniscus controlling feature and the gas knife system.

9. The fluid handling structure of claim 1, wherein the plurality of first passages or the plurality of second passages are supplied with $CO_2$.

10. The fluid handling structure of claim 1, wherein a spacing between two adjacent first exits is different than a spacing between two adjacent second exits.

11. The fluid handling structure of claim 1, configured such that a second exit of the second exits is arranged at a greater distance from a substrate than a first exit of the first exits.

12. A fluid handling structure configured to confine immersion fluid to a region in an immersion lithographic apparatus and comprising:
a gas knife system comprising a plurality of passages, the passages comprising:
a plurality of first passages having a plurality of corresponding first exits, on a surface of the fluid handling structure, to supply gas out of the fluid handling structure to the region, and
a plurality of second passages having a plurality of corresponding second exits, outwards of the first exits on the surface of the fluid handling structure, to supply gas out of the fluid handling structure to the region,
wherein at least one second passage is partly defined by a side wall that is inclined in a manner such that an angle of the side wall of the second passage to the vertical is between 0.5° and 7°.

13. The fluid handling structure of claim 12, wherein at least one first passage is partly defined by a side wall that is inclined in a manner such that an angle of the side wall of the first passage to the vertical is between 0.5° and 10°.

14. The fluid handling structure of claim 12, wherein at least one first passage of the plurality of first passages has a first entrance and at least one second passage of the plurality of second passages has a second entrance and a first ratio is a ratio of a dimension of the first exit to a dimension of the corresponding first entrance, and a second ratio is a ratio of a dimension of the second exit to a dimension of the corresponding second entrance, and the second ratio is larger than the first ratio.

15. The fluid handling structure of claim 12, configured such that a flow of gas passing through at least one first passage of the plurality of first passages and at least one second passage of the plurality of second passages is laminar.

16. The fluid handling structure of claim 12, configured such that a stagnation pressure of gas exiting a first exit of the first exits is greater than a stagnation pressure of gas exiting a second exit of the second exits.

17. The fluid handling structure of claim 12, further comprising a meniscus controlling feature having an extractor exit on the surface of the fluid handling structure, wherein the surface faces and is substantially parallel to a top surface of a substrate during exposure, and a first exit of the first exits and a second exit of the second exits are arranged at a greater distance from the substrate than the extractor exit.

18. The fluid handling structure of claim 17, further comprising at least one additional gas outlet between the meniscus controlling feature and the gas knife system.

19. The fluid handling structure of claim 12, wherein a spacing between two adjacent first exits is different than a spacing between two adjacent second exits.

20. The fluid handling structure of claim 12, configured such that a second exit of the second exits is arranged at a greater distance from a substrate than a first exit of the first exits.

* * * * *